(12) United States Patent
Hsu et al.

(10) Patent No.: US 12,394,698 B2
(45) Date of Patent: Aug. 19, 2025

(54) UNDERFILL CUSHION FILMS FOR PACKAGING SUBSTRATES AND METHODS OF FORMING THE SAME

(71) Applicant: Taiwan Semiconductor Manufacturing Company Limited, Hsinchu (TW)

(72) Inventors: Chia-Kuei Hsu, Hsinchu (TW); Ming-Chih Yew, Hsinchu (TW); Shu-Shen Yeh, Taoyuan (TW); Po-Yao Lin, Zhudong Township (TW); Shin-Puu Jeng, Po-Shan Village (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 468 days.

(21) Appl. No.: 17/859,038

(22) Filed: Jul. 7, 2022

(65) Prior Publication Data

US 2023/0023380 A1    Jan. 26, 2023

Related U.S. Application Data

(60) Provisional application No. 63/224,879, filed on Jul. 23, 2021.

(51) Int. Cl.
*H01L 23/498* (2006.01)
*H01L 21/48* (2006.01)
(Continued)

(52) U.S. Cl.
CPC .... *H01L 23/49816* (2013.01); *H01L 21/4853* (2013.01); *H01L 21/563* (2013.01);
(Continued)

(58) Field of Classification Search
CPC . H01L 21/4853; H01L 21/563; H01L 21/561; H01L 21/565; H01L 23/49816;
(Continued)

(56) References Cited

U.S. PATENT DOCUMENTS

| 6,291,264 B1 * | 9/2001 | Tang | H01L 24/32 |
| | | | 257/E21.503 |
| 2012/0068353 A1 * | 3/2012 | Huang | H01L 23/49816 |
| | | | 257/774 |

(Continued)

FOREIGN PATENT DOCUMENTS

| EP | 3671831 A1 * | 6/2020 | ....... H01L 23/49816 |
| TW | I758129 B * | 3/2022 | ......... H01L 21/4853 |
| WO | WO 2021/081943 A1 * | 5/2021 | ........... H01L 23/488 |

*Primary Examiner* — Fernando L Toledo
*Assistant Examiner* — Ryan T. Fortin
(74) *Attorney, Agent, or Firm* — The Marbury Law Group, PLLC

(57) ABSTRACT

A semiconductor structure includes a fan-out package comprising at least one semiconductor die, a redistribution structure comprising fan-out bonding pads, and a first underfill material portion, a packaging substrate comprising chip-side bonding pads, solder material portions bonded to the chip-side bonding pads and the fan-out bonding pads, a second underfill material portion laterally surrounding the solder material portions, and at least one cushioning film located on the packaging substrate and contacting the second underfill material portion and having a Young's modulus that is lower than a Young's modulus of the second underfill material portion.

20 Claims, 28 Drawing Sheets

(51) Int. Cl.
*H01L 21/56* (2006.01)
*H01L 23/00* (2006.01)
*H01L 25/065* (2023.01)

(52) U.S. Cl.
CPC .. *H01L 23/49833* (2013.01); *H01L 23/49838* (2013.01); *H01L 25/0652* (2013.01); H01L 21/561 (2013.01); H01L 21/565 (2013.01); H01L 23/49822 (2013.01); H01L 24/16 (2013.01); H01L 24/32 (2013.01); H01L 24/73 (2013.01); H01L 24/96 (2013.01); H01L 24/97 (2013.01); H01L 2224/16145 (2013.01); H01L 2224/16227 (2013.01); H01L 2224/16238 (2013.01); H01L 2224/32145 (2013.01); H01L 2224/32225 (2013.01); H01L 2224/73204 (2013.01); H01L 2924/1431 (2013.01); H01L 2924/1432 (2013.01); H01L 2924/1437 (2013.01); H01L 2924/182 (2013.01); H01L 2924/3512 (2013.01)

(58) Field of Classification Search
CPC ......... H01L 23/49833; H01L 23/49838; H01L 23/49822; H01L 24/16; H01L 24/32; H01L 24/73; H01L 24/96; H01L 24/97; H01L 25/0652; H01L 2224/16145; H01L 2224/16227; H01L 2224/16238; H01L 2224/32145; H01L 2224/32225; H01L 2224/73204; H01L 2924/1431; H01L 2924/1432; H01L 2924/1437; H01L 2924/182; H01L 2924/3512
See application file for complete search history.

(56) References Cited

U.S. PATENT DOCUMENTS

| | | | |
|---|---|---|---|
| 2014/0252634 A1* | 9/2014 | Hung | H01L 25/50 257/773 |
| 2016/0056057 A1* | 2/2016 | Yu | H01L 24/19 257/774 |
| 2017/0373050 A1* | 12/2017 | Shao | H01L 23/49838 |
| 2018/0204807 A1* | 7/2018 | Aizawa | H01L 23/5383 |
| 2018/0366439 A1* | 12/2018 | Lin | H01L 23/49838 |
| 2020/0105705 A1* | 4/2020 | Cheng | H01L 25/50 |
| 2021/0343677 A1* | 11/2021 | Atadana | H01L 23/293 |
| 2022/0068839 A1* | 3/2022 | Ke | H01L 23/562 |
| 2022/0342150 A1* | 10/2022 | Karhade | G02B 6/4274 |

* cited by examiner

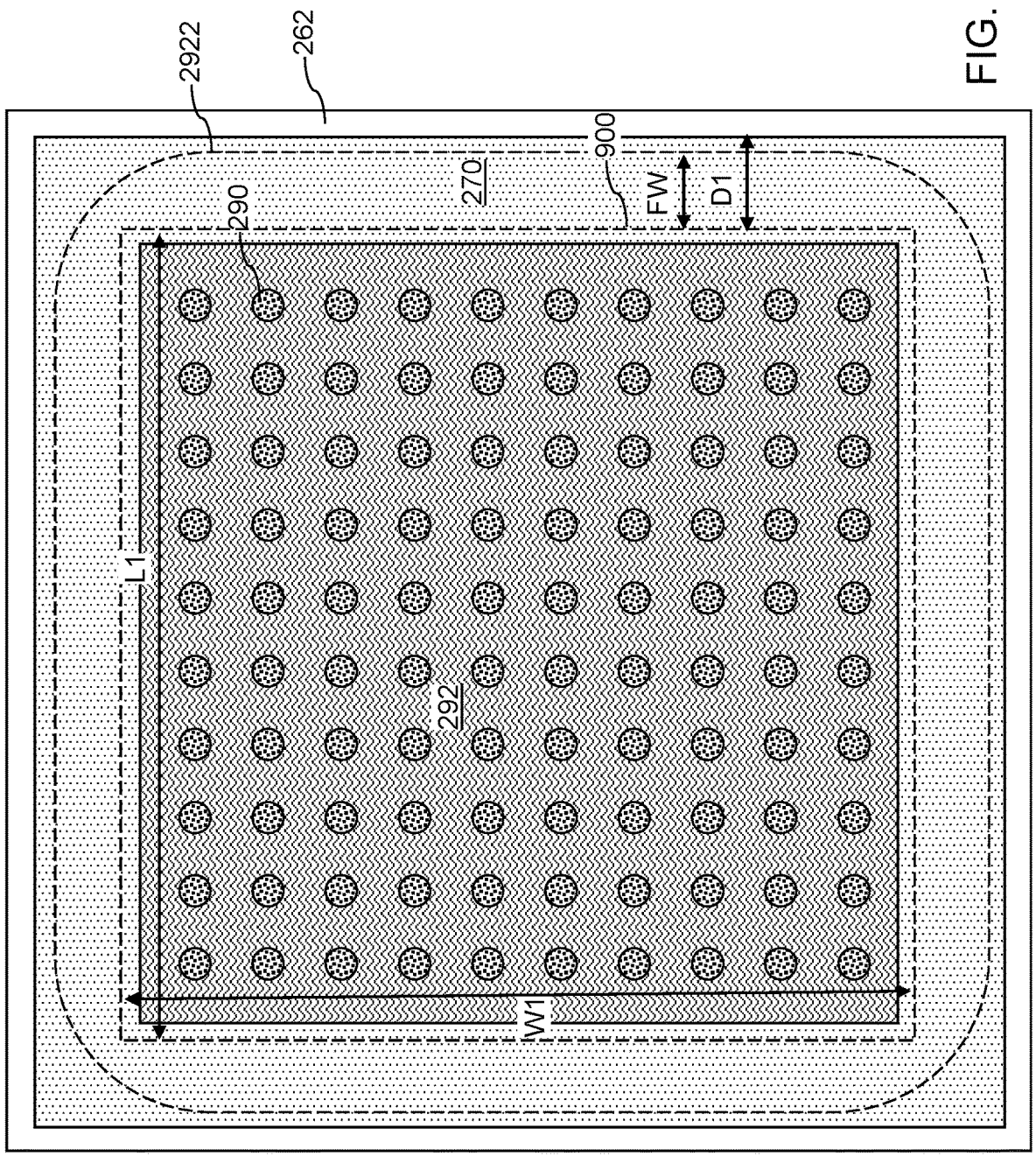

12,394,698 B2

UNDERFILL CUSHION FILMS FOR PACKAGING SUBSTRATES AND METHODS OF FORMING THE SAME

RELATED APPLICATIONS

This application claims priority from U.S. Provisional Application Ser. No. 63/224,879 titled "UF fillet cushion film for reliability improvement" and filed on Jul. 23, 2021, the entire contents of which are incorporated herein by reference.

BACKGROUND

Interfaces between a fan-out wafer level package (FOWLP) and an underfill material portion are subjected to mechanical stress during subsequent handling of an assembly of the FOWLP, the underfill material portion, and a packaging substrate, such as the mechanical stress associated with attaching the packaging substrate to a printed circuit board (PCB). In addition, interfaces between a FOWLP and an underfill material portion are subjected to mechanical stress during use within a computing device, such as when a mobile device is accidently dropped to cause a mechanical shock during usage. Cracks may be formed in the underfill material, and may induce additional cracks in a semiconductor die, solder material portions, redistribution structures, and/or various dielectric layers within a semiconductor die or within a packaging substrate. Thus, suppression of the formation of cracks in the underfill material is desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 15A is a horizontal cross-sectional view of a first alternative embodiment of the exemplary structure along a horizontal plane that corresponds to the horizontal plane B-B' of FIG. 14A.

DETAILED DESCRIPTION

Figure 1A:
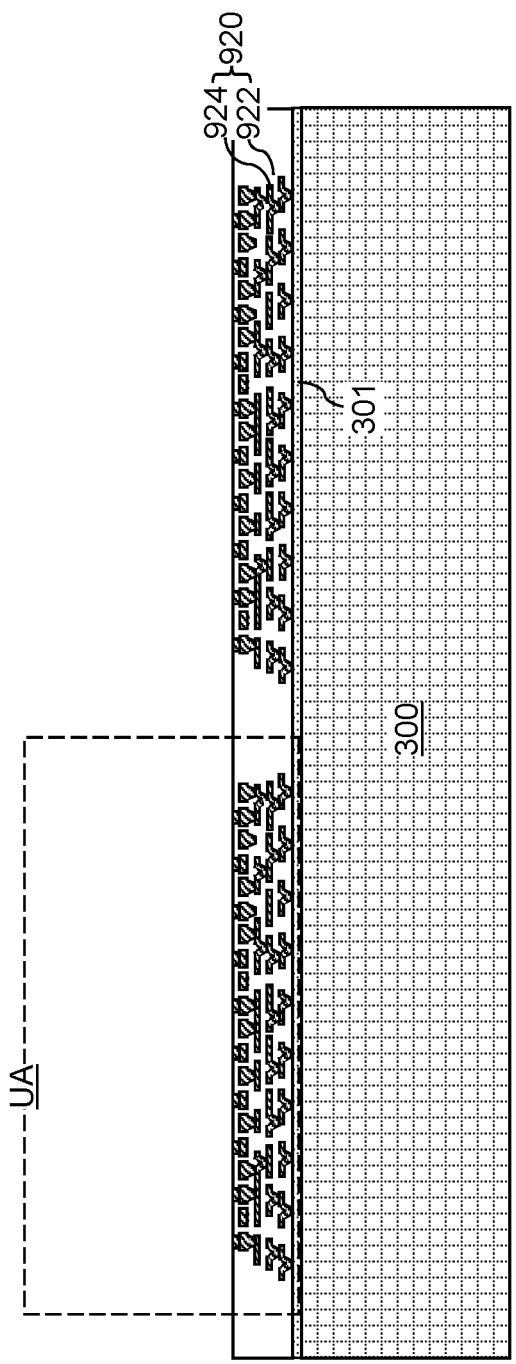
FIG. 1A is a vertical cross-sectional view of a region of an exemplary structure that includes a first carrier substrate and redistribution structures according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

The present disclosure is directed to semiconductor devices, and particularly to uniform application of an underfill material in semiconductor die packaging. Generally, the methods and structures of the present disclosure may be used to provide a chip package structure such as a FOWLP and fan-out panel level package (FOPLP). While the present disclosure is described using an FOWLP configuration, the methods and structures of the present disclosure may be implemented in an FOPLP configuration or any other fan-out package configuration.

Fan-out packages are subject to deformation under stress during subsequent assembly processes and/or during operation under mechanical stress and/or under heat. According to an aspect of the present disclosure, deformation of a fan-out package may be reduced by using at least one cushioning film that may be incorporated into a fan-out package. The at least one cushioning film may have a lower Young's modulus and/or a higher coefficient of thermal expansion than a molding compound material that laterally surrounds at least one semiconductor die in a fan-out package. The cushioning film may help to prevent or reduce deformation of a fan-out package under mechanical stress or under thermal stress.

Typically, heterogeneous integration is used to integrate a large interposer (such as a CoWoS interposer or an organic interposer) and a high electrical performance substrate (such as a multi-layer core or a multilayer substrate which may include 12 or more layers) for a high performance chip. The effective coefficient of thermal expansion for such a structure may be more than four times the coefficient of thermal expansion for silicon. Such a large mismatch of coefficients of thermal expansion between a substrate and semiconductor dies on an interposer may often result in molding cracks at fan-out module corners. For these reasons, large fan-out modules formed by molding have high crack risk at the corners. According to an aspect of the present disclosure, an embedded cushioning film may be provided on an interposer such as a redistribution structure to effectively reduce the molding stress, thereby preventing formation of molding cracks in corner regions of an interposer, and providing enhanced reliability to the interposer. The various aspects and embodiments of the methods and structures of the present disclosure are described with reference to accompanying drawings herebelow.

Figure 1B:
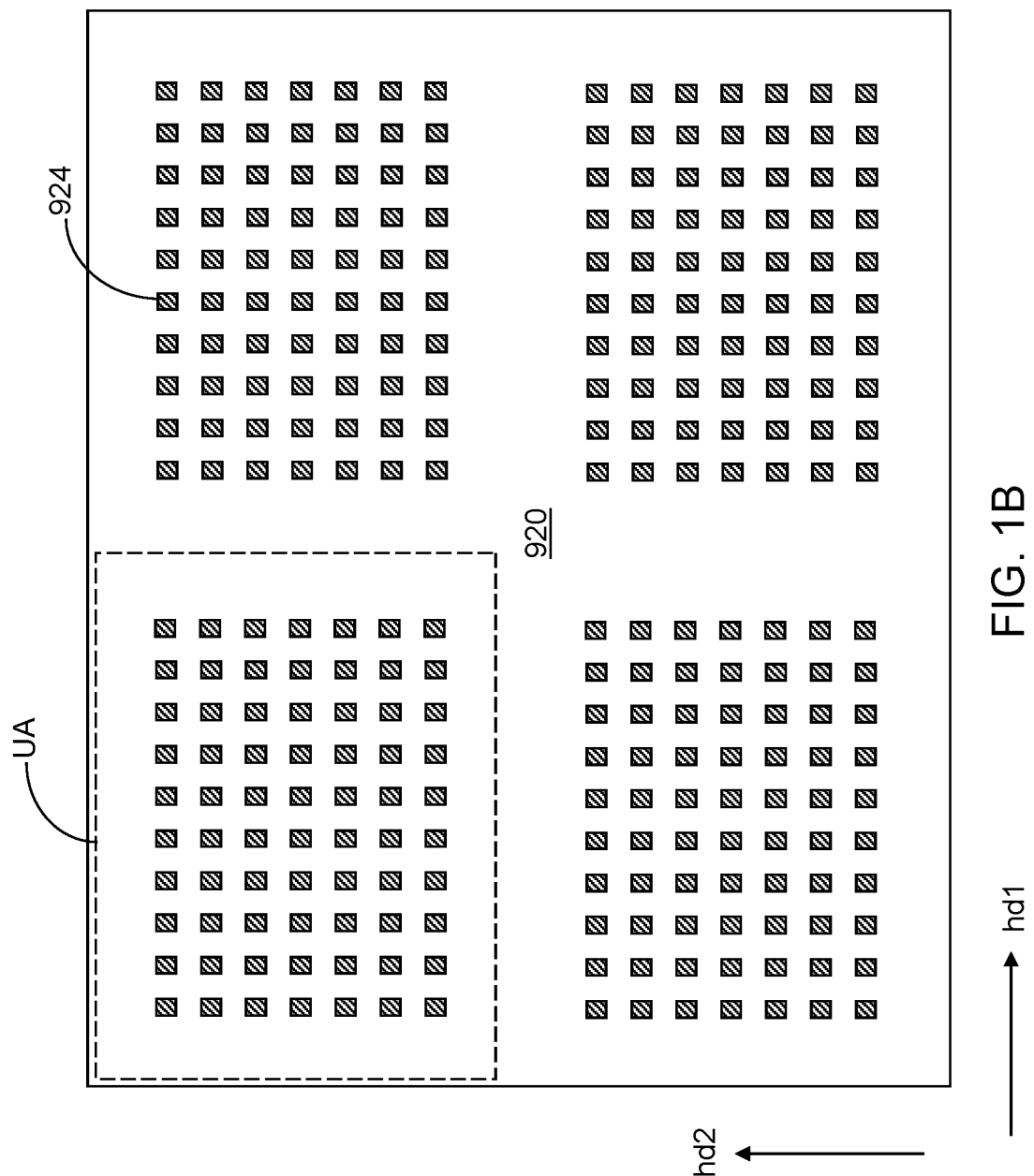
FIG. 1B is a top-down view of the region of the exemplary structure of FIG. 1A.

Referring to FIGS. 1A and 1B, an exemplary structure according to an embodiment of the present disclosure may include a first carrier substrate 300 and redistribution structures 920 formed on a front side surface of the first carrier substrate 300. The first carrier substrate 300 may include an optically transparent substrate such as a glass substrate or a sapphire substrate. The diameter of the first carrier substrate 300 may be in a range from 150 mm to 290 mm, although lesser and greater diameters may be used. In addition, the thickness of the first carrier substrate 300 may be in a range from 500 microns to 2,000 microns, although lesser and greater thicknesses may also be used. Alternatively, the first carrier substrate 300 may be provided in a rectangular panel format. The dimensions of the first carrier substrate 300 in such alternative embodiments may be substantially the same.

A first adhesive layer 301 may be applied to the front-side surface of the first carrier substrate 300. In one embodiment, the first adhesive layer 301 may be a light-to-heat conversion (LTHC) layer. The LTHC layer may be a solvent-based coating applied using a spin coating method. The LTHC layer may convert ultraviolet light to heat, which may cause the material of the LTHC layer to lose adhesion. Alternatively, the first adhesive layer 301 may include a thermally decomposing adhesive material. For example, the first adhesive layer 301 may include an acrylic pressure-sensitive adhesive that decomposes at an elevated temperature. The debonding temperature of the thermally decomposing adhesive material may be in a range from 150 degrees to 200 degrees Celsius.

Redistribution structures 920 may be formed over the first adhesive layer 301. Specifically, a redistribution structure 920 may be formed within each unit area UA, which is the area of a repetition unit that may be repeated in a two-dimensional array over the first carrier substrate 300. Each redistribution structure 920 may include redistribution dielectric layers 922 and redistribution wiring interconnects 924. The redistribution dielectric layers 922 include a respective dielectric polymer material such as polyimide (PI), benzocyclobutene (BCB), or polybenzobisoxazole (PBO). Other suitable materials may be within the contemplated scope of disclosure. Each redistribution dielectric layer 922 may be formed by spin coating and drying of the respective dielectric polymer material. The thickness of each redistribution dielectric layer 922 may be in a range from 2 microns to 40 microns, such as from 4 microns to 20 microns. Each redistribution dielectric layer 922 may be patterned, for example, by applying and patterning a respective photoresist layer thereabove, and by transferring the pattern in the photoresist layer into the redistribution dielectric layer 922 using an etch process such as an anisotropic etch process. The photoresist layer may be subsequently removed, for example, by ashing.

Each of the redistribution wiring interconnects 924 may be formed by depositing a metallic seed layer by sputtering, by applying and patterning a photoresist layer over the metallic seed layer to form a pattern of openings through the photoresist layer, by electroplating a metallic fill material (such as copper, nickel, or a stack of copper and nickel), by removing the photoresist layer (for example, by ashing), and by etching portions of the metallic seed layer located between the electroplated metallic fill material portions. The metallic seed layer may include, for example, a stack of a titanium barrier layer and a copper seed layer. The titanium barrier layer may have thickness in a range from 50 nm to 400 nm, and the copper seed layer may have a thickness in a range from 100 nm to 500 nm. The metallic fill material for the redistribution wiring interconnects 924 may include copper, nickel, or copper and nickel. Other suitable metallic fill materials are within the contemplated scope of disclosure. The thickness of the metallic fill material that is deposited for each redistribution wiring interconnect 924 may be in a range from 2 microns to 40 microns, such as from 4 microns to 10 microns, although lesser or greater thicknesses may also be used. The total number of levels of wiring in each redistribution structure 920 (i.e., the levels of the redistribution wiring interconnects 924) may be in a range from 1 to 10. A periodic two-dimensional array (such as a rectangular array) of redistribution structures 920 may be formed over the first carrier substrate 300. Each redistribution structure 920 may be formed within a unit area UA. The layer including all redistribution structures 920 is herein referred to as a redistribution structure layer. The redistribution structure layer includes a two-dimensional array of redistribution structures 920. In one embodiment, the two-dimensional array of redistribution structures 920 may be a rectangular periodic two-dimensional array of redistribution structures 920 having a first periodicity along a first horizontal direction hd1 and having a second periodicity along a second horizontal direction hd2 that is perpendicular to the first horizontal direction hd1.

Figure 2A:
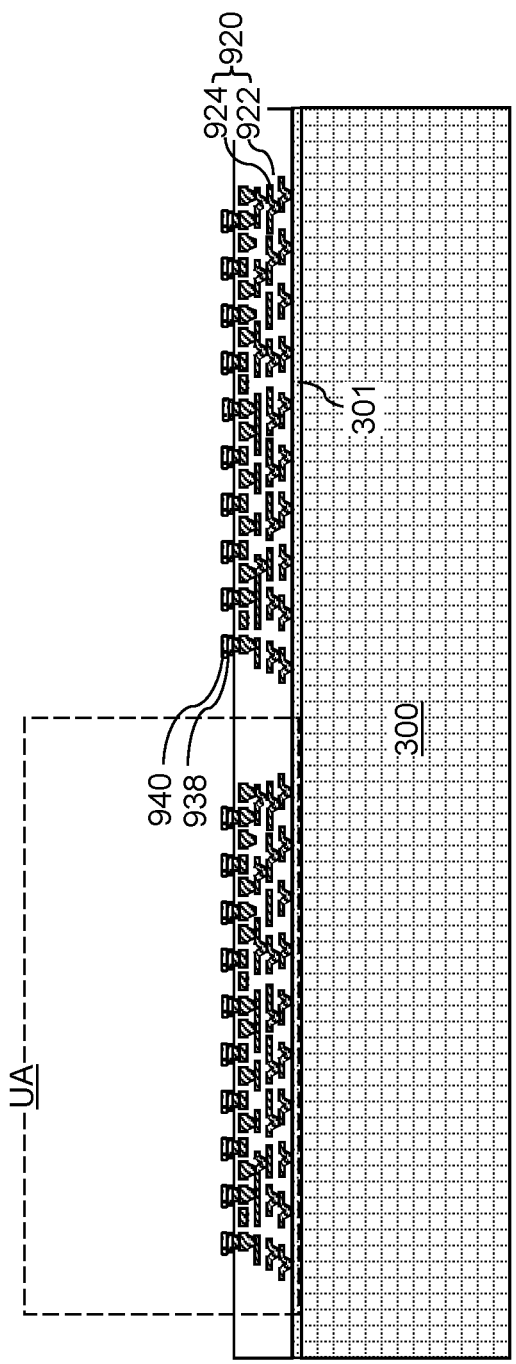
FIG. 2A is vertical cross-sectional view of a region of the exemplary structure after formation of redistribution-side bonding structures and first solder material portions according to an embodiment of the present disclosure.
Figure 2B:
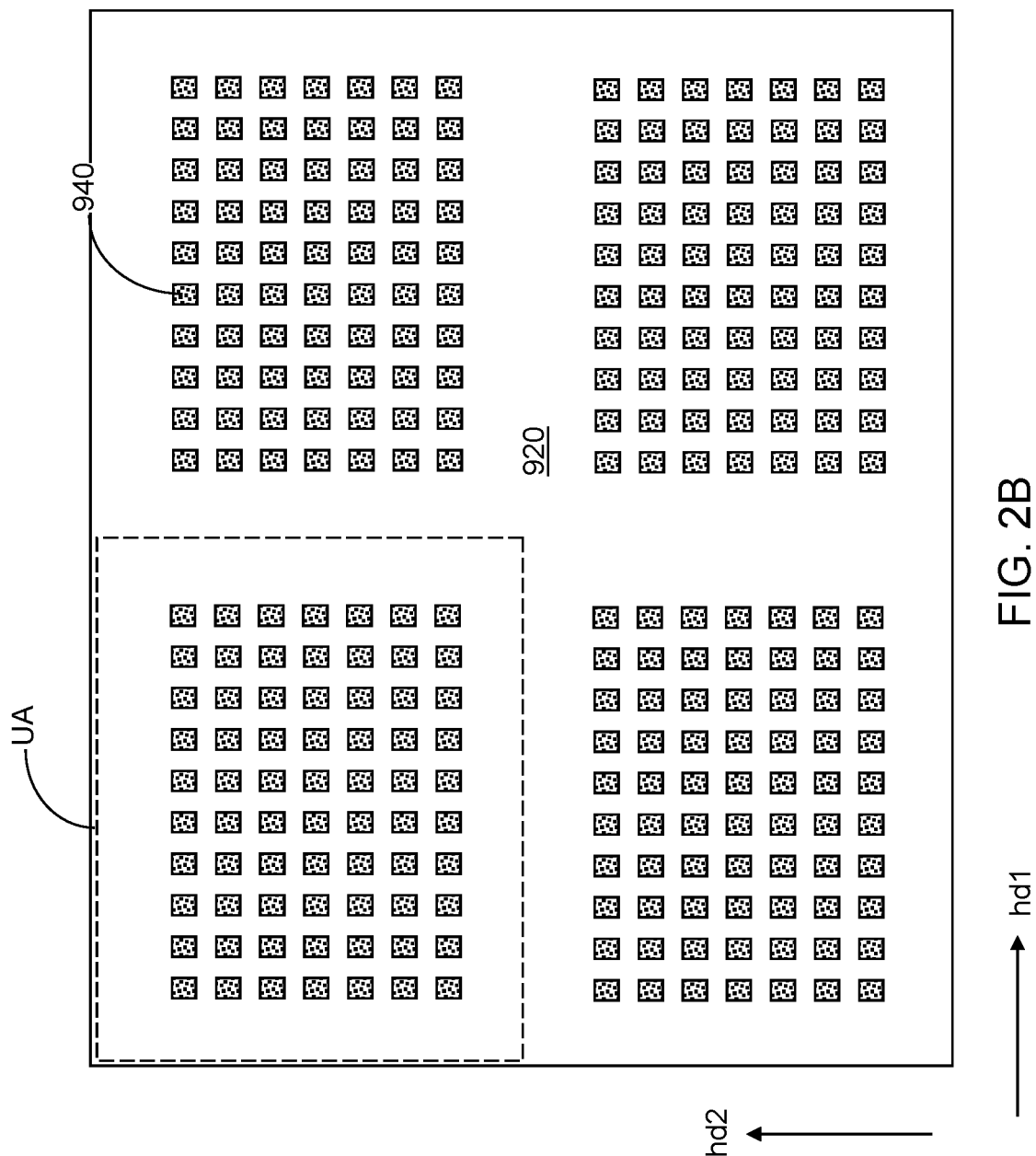
FIG. 2B is a top-down view of the region of the exemplary structure of FIG. 2A.

Referring to FIGS. 2A and 2B, at least one metallic material and a first solder material may be sequentially deposited over the front-side surface of the redistribution structures 920. The at least one metallic material comprises a material that may be used for metallic bumps, such as copper. The thickness of the at least one metallic material may be in a range from 5 microns to 60 microns, such as from 10 microns to 30 microns, although lesser and greater thicknesses may also be used. The first solder material may comprise a solder material suitable for C2 bonding, i.e., for microbump bonding. The thickness of the first solder material may be in a range from 2 microns to 30 microns, such as from 4 microns to 15 microns, although lesser and greater thicknesses may also be used.

The first solder material and the at least one metallic material may be patterned into discrete arrays of first solder material portions 940 and arrays of metal bonding structures, which are herein referred to as arrays of redistribution-side bonding structures 938. Each array of redistribution-side bonding structures 938 is formed within a respective unit area UA. Each array of first solder material portions 940 is formed within a respective unit area UA. Each first solder material portion 940 may have a same horizontal cross-sectional shape as an underlying redistribution-side bonding structures 938.

In one embodiment, the redistribution-side bonding structures 938 may include, and/or may consist essentially of, copper or a copper-containing alloy. Other suitable materials are within the contemplated scope of disclosure. The thickness of the redistribution-side bonding structures 938 may be in a range from 5 microns to 60 microns, although lesser or greater thicknesses may also be used. The redistribution-side bonding structures 938 may have horizontal cross-sectional shapes of rectangles, rounded rectangles, circles, regular polygons, irregular polygons, or any other two-dimensional curvilinear shape having a closed periphery. In one embodiment, redistribution-side bonding structures 938 may be configured for microbump bonding (i.e., C2 bonding), and may have a thickness in a range from 10 microns to 30 microns, although lesser or greater thicknesses may also be used. In this embodiment, each array of redistribution-side bonding structures 938 may be formed as an array of microbumps (such as copper pillars) having a lateral dimension in a range from 10 microns to 25 microns, and having a pitch in a range from 20 microns to 50 microns.

Figure 3A:
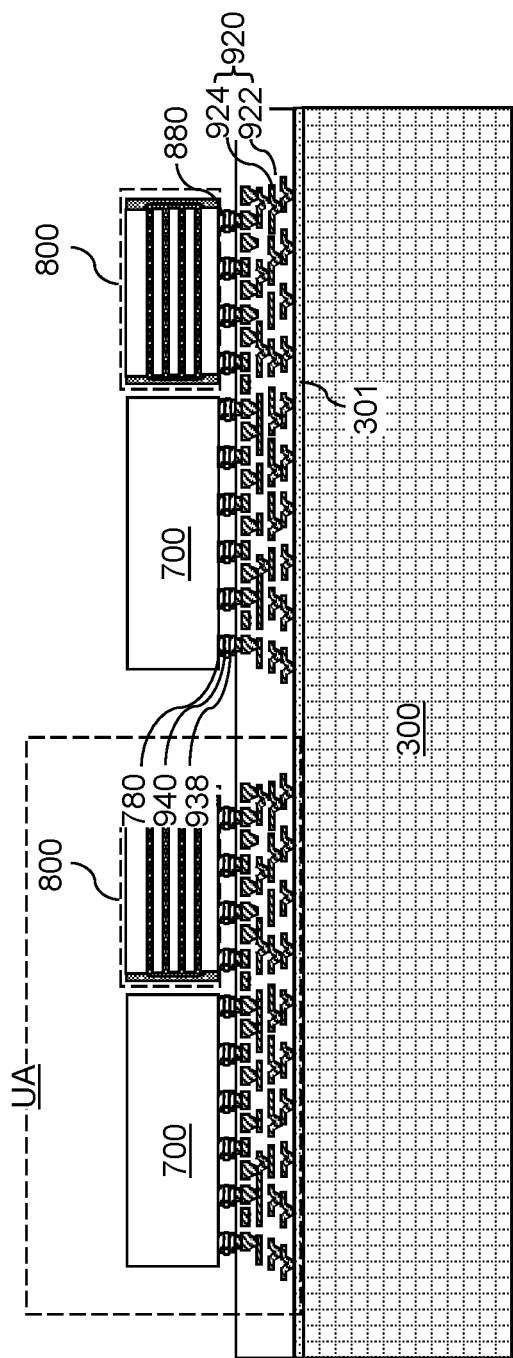
FIG. 3A is a vertical cross-sectional view of a region the exemplary structure after attaching semiconductor dies according to an embodiment of the present disclosure.
Figure 3B:
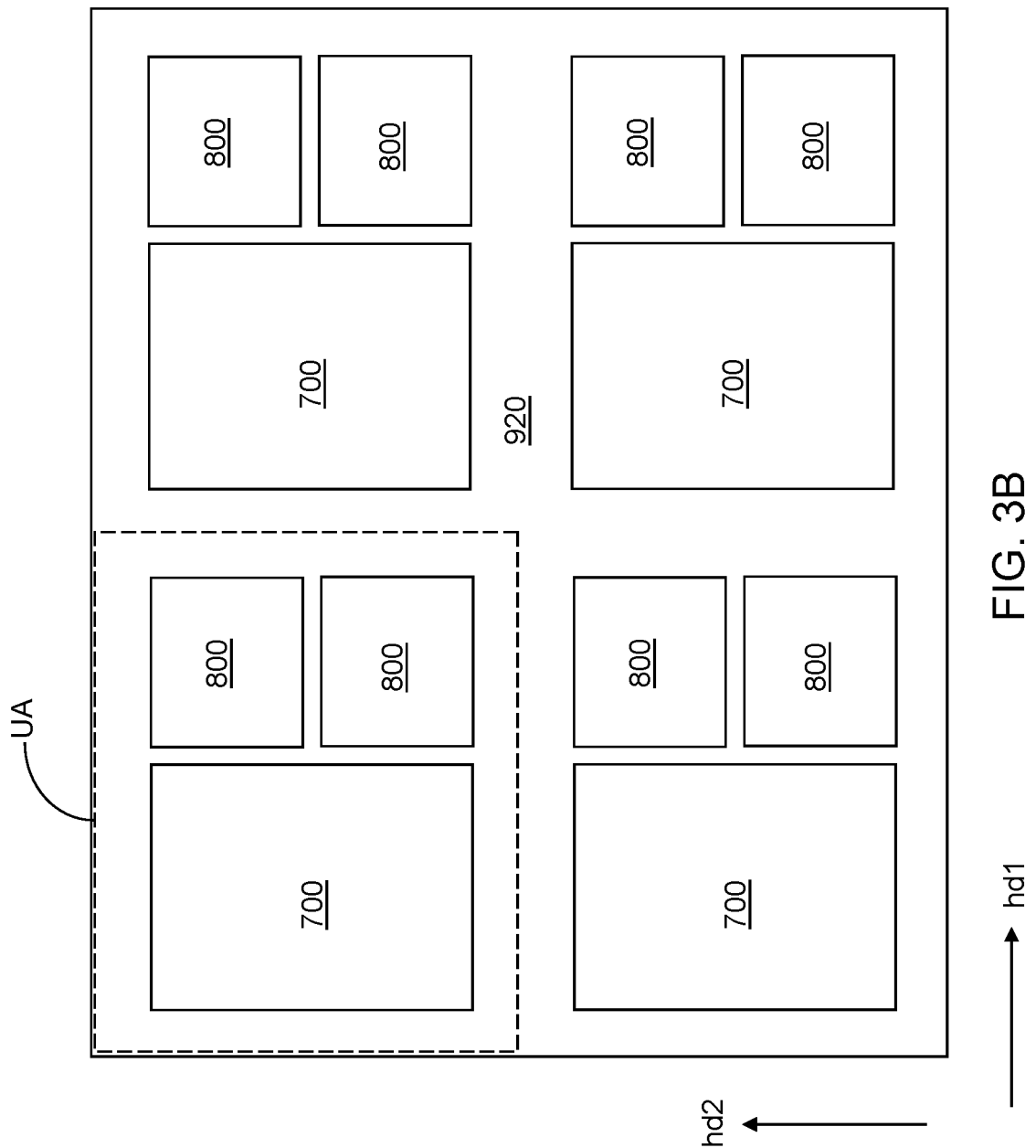
FIG. 3B is a top-down view of the region of the exemplary structure of FIG. 4A.

Referring to FIGS. 3A and 3B, a set of at least one semiconductor die (700, 800) may be bonded to each redistribution structure 920. In one embodiment, the redistribution structures 920 may be arranged as a two-dimensional periodic array, and multiple sets of at least one semiconductor die (700, 800) may be bonded to the redistribution structures 920 as a two-dimensional periodic rectangular array of sets of the at least one semiconductor die (700, 800). Each set of at least one semiconductor die (700, 800) includes at least one semiconductor die. Each set of at least one semiconductor die (700, 800) may include any set of at least one semiconductor die known in the art. In one embodiment, each set of at least one semiconductor die (700, 800) may comprise a plurality of semiconductor dies (700, 800). For example, each set of at least one semiconductor die (700, 800) may include at least one system-on-chip (SoC) die 700 and/or at least one memory die 800. Each SoC die 700 may comprise an application processor die, a central processing unit die, or a graphic processing unit die. In one embodiment, the at least one memory die 800 may comprise a high bandwidth memory (HBM) die that includes a vertical stack of static random access memory dies. In one embodiment, the at least one semiconductor die (700, 800) may include at least one system-on-chip (SoC) die and a high bandwidth memory (HBM) die including a vertical stack of static random access memory (SRAM) dies that are interconnected to one another through microbumps and are laterally surrounded by an epoxy molding material enclosure frame.

Each semiconductor die (700, 800) may comprise a respective array of die-side bonding structures (780, 880). For example, each SoC die 700 may comprise an array of SoC metal bonding structures 780, and each memory die 800 may comprise an array of memory-die metal bonding structures 880. Each of the semiconductor dies (700, 800) may be positioned in a face-down position such that die-side bonding structures (780, 880) face the first solder material portions 940. Each set of at least one semiconductor die (700, 800) may be placed within a respective unit area UA. Placement of the semiconductor dies (700, 800) may be performed using a pick and place apparatus such that each of the die-side bonding structures (780, 880) may be placed on a top surface of a respective one of the first solder material portions 940.

Generally, a redistribution structure 920 including redistribution-side bonding structures 938 thereupon may be provided, and at least one semiconductor die (700, 800) including a respective set of die-side bonding structures (780, 880) may be provided. The at least one semiconductor die (700, 800) may be bonded to the redistribution structure 920 using first solder material portions 940 that are bonded to a respective redistribution-side bonding structure 938 and to a respective one of the die-side bonding structures (780, 880).

Each set of at least one semiconductor die (700, 800) may be attached to a respective redistribution structure 920 through a respective set of first solder material portions 940. Each of the at least one cushioning film within a unit area UA may be located outside an area including the at least one semiconductor die (700, 800) in the unit area UA in a plan view. The plan view is a view along a vertical direction, which is the direction that is perpendicular to the planar top surface of the redistribution structure layer.

Figure 3C:
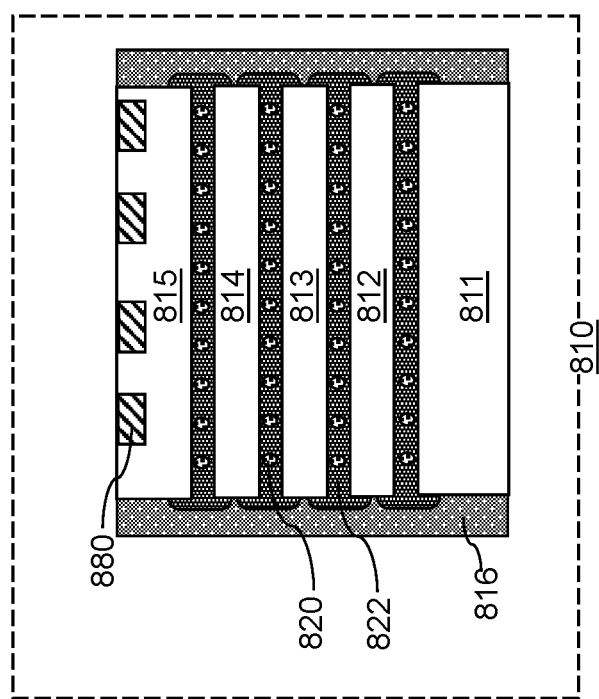
FIG. 3C is a magnified vertical cross-sectional view of a high bandwidth memory die.

Referring to FIG. 3C, a high bandwidth memory (HBM) die 810 is illustrated, which may be used as a memory die 800 within the exemplary structures of FIGS. 3A and 3B. The HBM die 810 may include a vertical stack of static random access memory dies (811, 812, 813, 814, 815) that are interconnected to one another through microbumps 820 and are laterally surrounded by an epoxy molding material enclosure frame 816. The gaps between vertically neighboring pairs of the random access memory dies (811, 812, 813, 814, 815) may be filled with a HBM underfill material portion 822 that laterally surrounds a respective set of microbumps 820. The HBM die 810 may comprise an array of memory-die metal bonding structures 880 configured to be bonded to a subset of an array of redistribution-side bonding structures 938 within a unit area UA. The HBM die 810 may be configured to provide a high bandwidth as defined under JEDEC standards, i.e., standards defined by The JEDEC Solid State Technology Association.

Figure 4:
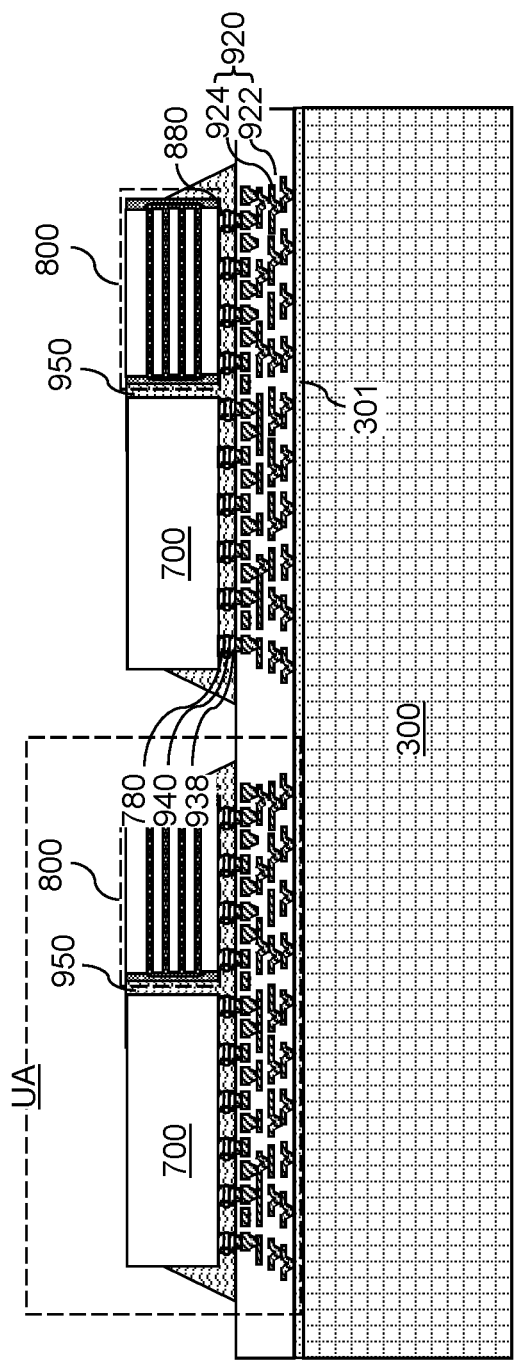
FIG. 4 is a vertical cross-sectional view of a region of the exemplary structure after formation of first underfill material portions.

Referring to FIG. 4, a first underfill material may be applied into each gap between the redistribution structures 920 and sets of at least one semiconductor die (700, 800) that are bonded to the redistribution structures 920. The first underfill material may comprise any underfill material known in the art. A first underfill material portion 950 may be formed within each unit area UA between a redistribution structure 920 and an overlying set of at least one semiconductor die (700, 800). The first underfill material portions 950 may be formed by injecting the first underfill material around a respective array of first solder material portions 940 in a respective unit area UA. Any known underfill material application method may be used, which may be, for example, the capillary underfill method, the molded underfill method, or the printed underfill method.

Within each unit area UA, a first underfill material portion 950 may laterally surround, and contact, each of the first solder material portions 940 within the unit area UA. The first underfill material portion 950 may be formed around, and contact, the first solder material portions 940, the redistribution-side bonding structures 938, and the die-side bonding structures (780, 880) in the unit area UA.

Each redistribution structure 920 in a unit area UA comprises redistribution-side bonding structures 938. At least one semiconductor die (700, 800) comprising a respective set of die-side bonding structures (780, 880) is attached to the redistribution-side bonding structures 938 through a respective set of first solder material portions 940 within each unit area UA. Within each unit area UA, a first underfill material portion 950 laterally surrounds the redistribution-side bonding structures 938 and the die-side bonding structures (780, 880) of the at least one semiconductor die (700, 800).

Figure 5A:
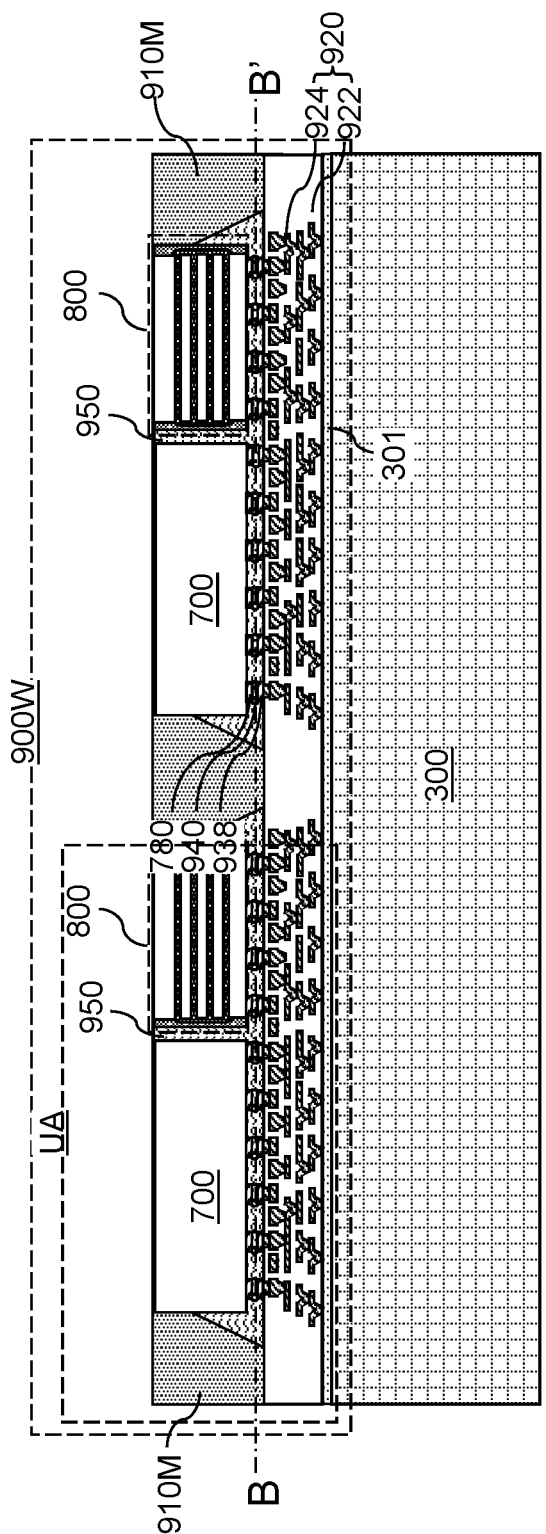
FIG. 5A is a vertical cross-sectional view of a region of the exemplary structure after formation of an epoxy molding compound (EMC) matrix according to an embodiment of the present disclosure.
Figure 5B:
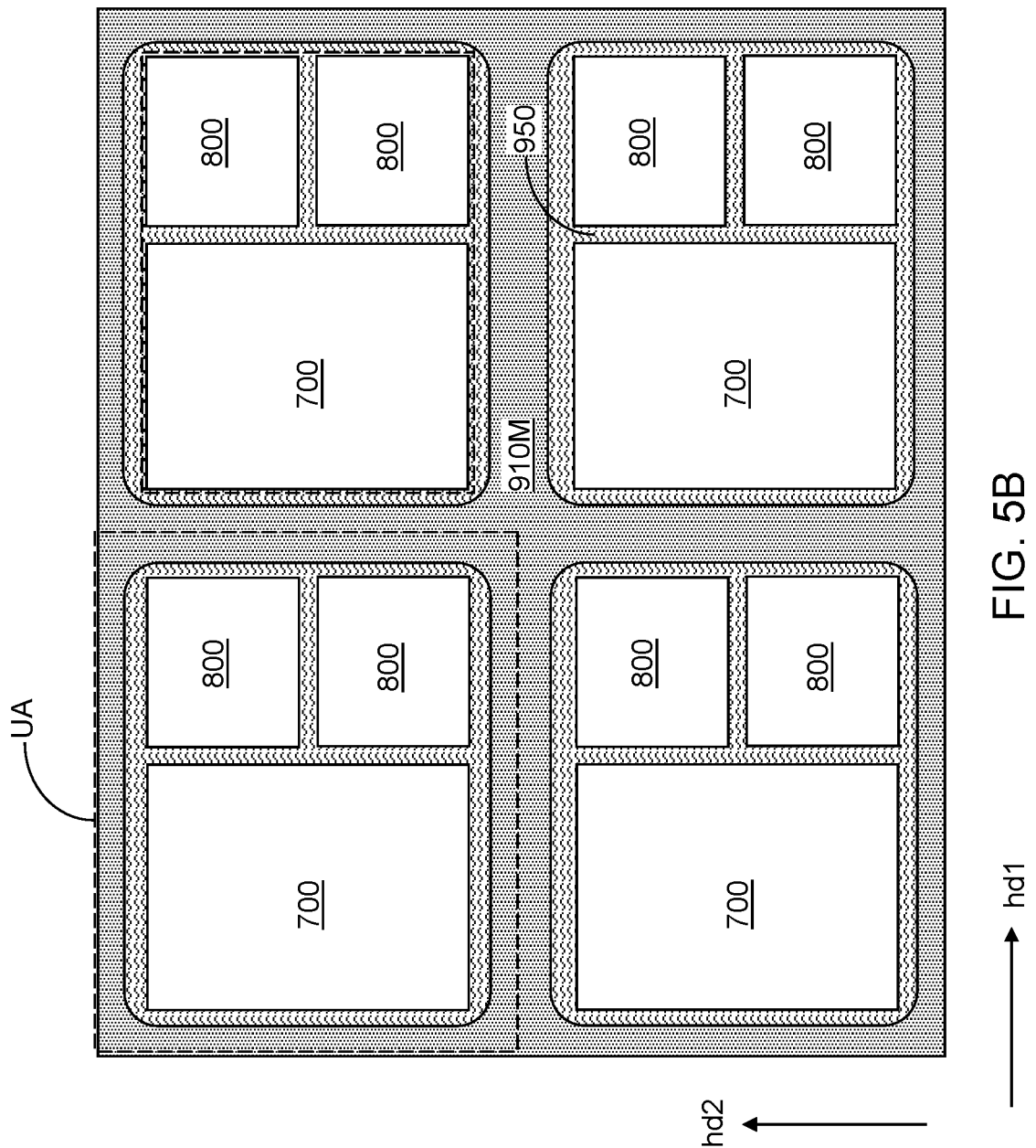
FIG. 5B is a top-down view of the region of the exemplary structure of FIG. 5A.

Referring to FIGS. 5A and 5B, an epoxy molding compound (EMC) may be applied to the gaps between contiguous assemblies of a respective set of semiconductor dies (700, 800) and a first underfill material portion 950.

The EMC may include an epoxy-containing compound that may be hardened (i.e., cured) to provide a dielectric material portion having sufficient stiffness and mechanical strength. The EMC may include epoxy resin, hardener, silica (as a filler material), and other additives. The EMC may be provided in a liquid form or in a solid form depending on the viscosity and flowability. Liquid EMC provides better handling, good flowability, less voids, better fill, and less flow marks. Solid EMC provides less cure shrinkage, better stand-off, and less die drift. A high filler content (such as 85% in weight) within an EMC may shorten the time in mold, lower the mold shrinkage, and reduce the mold warpage. Uniform filler size distribution in the EMC may reduce flow marks, and may enhance flowability. The curing temperature of the EMC may be lower than the release (debonding) temperature of the first adhesive layer 301 in embodiments in which the adhesive layer includes a thermally debonding material. For example, the curing temperature of the EMC may be in a range from 125° C. to 150° C.

The EMC may be cured at a curing temperature to form an EMC matrix 910M that laterally surrounds and embeds each assembly of a set of semiconductor dies (700, 800) and a first underfill material portion 950. The EMC matrix 910M includes a plurality of epoxy molding compound (EMC) die frames that may be laterally adjoined to one another. Each EMC die frame is a portion of the EMC matrix 910M that is located within a respective unit area UA. Thus, each EMC die frame laterally surrounds and embeds a respective a set of semiconductor dies (700, 800) and a respective first underfill material portion 950. Young's modulus of pure epoxy is about 3.35 GPa, and Young's modulus of the EMC may be higher than Young's modulus of pure epoxy by adding additives. Young's modulus of EMC may be greater than 3.5 GPa.

Portions of the EMC matrix 910M that overlie the horizontal plane including the top surfaces of the semiconductor dies (700, 800) may be removed by a planarization process. For example, the portions of the EMC matrix 910M that overlie the horizontal plane may be removed using a chemical mechanical planarization (CMP). The combination of the remaining portion of the EMC matrix 910M, the semiconductor dies (700, 800), the first underfill material portions 950, and the two-dimensional array of redistribution structures 920 comprises a reconstituted wafer 900W. Each portion of the EMC matrix 910M located within a unit area UA constitutes an EMC die frame.

Figure 6:
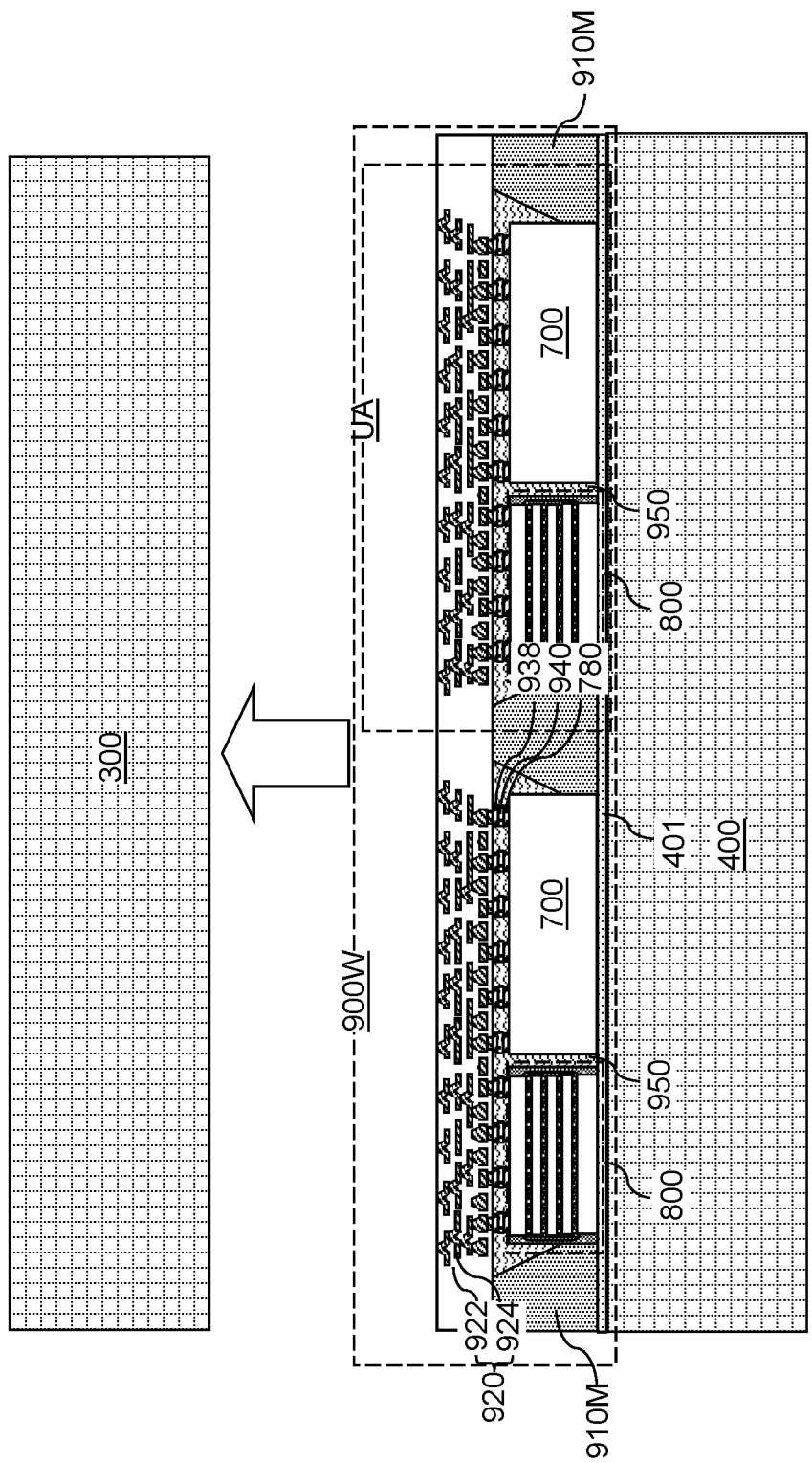
FIG. 6 is a vertical cross-sectional view of a region of the exemplary structure after attaching a second carrier substrate and detaching the first carrier substrate according to an embodiment of the present disclosure.

Referring to FIG. 6, a second adhesive layer 401 may be applied to the physically exposed planar surface of the reconstituted wafer 900W, i.e., the physically exposed surfaces of the EMC matrix 910M, the semiconductor dies (700, 800), and the first underfill material portions 950. In one embodiment, the second adhesive layer 401 may comprise a same material as, or may comprise a different material from, the material of the first adhesive layer 301. In embodiments in which the first adhesive layer 301 comprises a thermally decomposing adhesive material, the second adhesive layer 401 may comprise another thermally decomposing adhesive material that decomposes at a higher temperature, or may comprise a light-to-heat conversion material.

A second carrier substrate 400 may be attached to the second adhesive layer 401. The second carrier substrate 400 may be attached to the opposite side of the reconstituted wafer 900W relative to the first carrier substrate 300. Generally, the second carrier substrate 400 may comprise any material that may be used for the first carrier substrate 300. The thickness of the second carrier substrate 400 may be in a range from 500 microns to 2,000 microns, although lesser and greater thicknesses may also be used.

The first adhesive layer 301 may be decomposed by ultraviolet radiation or by a thermal anneal at a debonding temperature. In embodiments in which the first carrier substrate 300 includes an optically transparent material and the first adhesive layer 301 includes an LTHC layer, the first adhesive layer 301 may be decomposed by irradiating ultraviolet light through the transparent carrier substrate.

The LTHC layer may absorb the ultraviolet radiation and generate heat, which decomposes the material of the LTHC layer and causes the transparent first carrier substrate 300 to be detached from the reconstituted wafer 900W. In embodiments in which the first adhesive layer 301 includes a thermally decomposing adhesive material, a thermal anneal process at a debonding temperature may be performed to detach the first carrier substrate 300 from the reconstituted wafer 900W.

Figure 7:
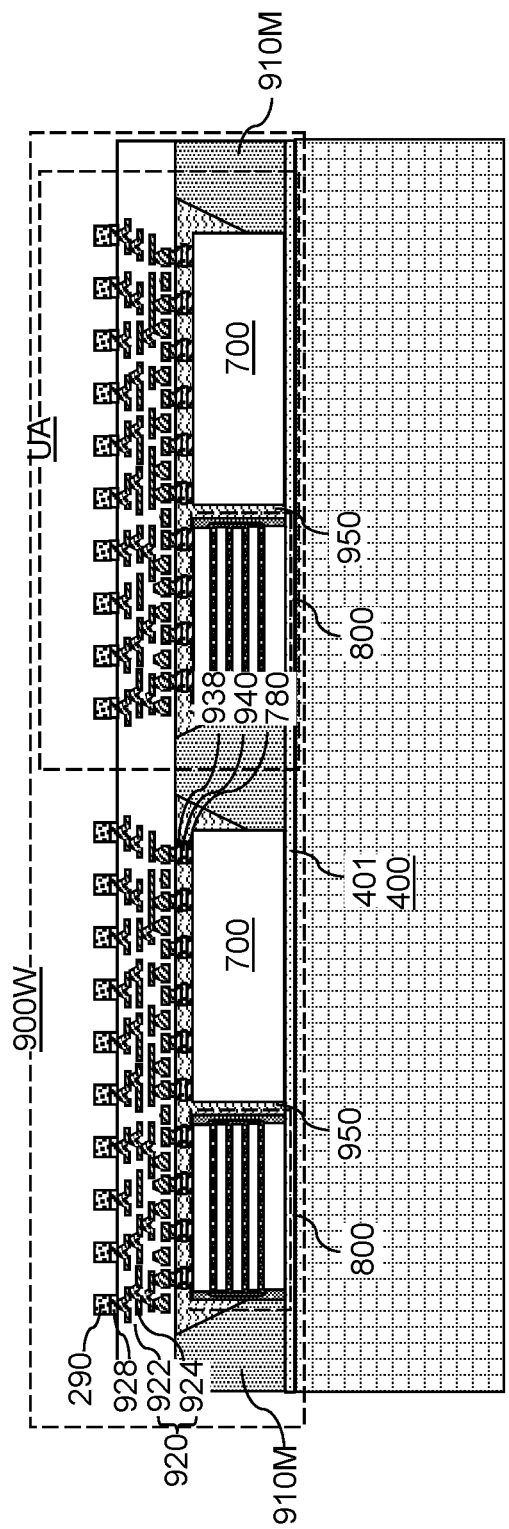
FIG. 7 is a vertical cross-sectional view of a region of the exemplary structure after formation of fan-out bonding pads according to an embodiment of the present disclosure.

Referring to FIG. 7, fan-out bonding pads 928 and second solder material portions 290 may be formed by depositing and patterning a stack of at least one metallic material that may function as metallic bumps and a solder material layer. The metallic fill material for the fan-out bonding pads 928 may include copper. Other suitable materials are within the contemplated scope of disclosure. The thickness of the fan-out bonding pads 928 may be in a range from 5 microns to 100 microns, although lesser or greater thicknesses may also be used. The fan-out bonding pads 928 and the second solder material portions 290 may have horizontal cross-sectional shapes of rectangles, rounded rectangles, or circles. Other suitable shapes are within the contemplated scope of disclosure. In embodiments in which the fan-out bonding pads 928 are formed as C4 (controlled collapse chip connection) pads, the thickness of the fan-out bonding pads 928 may be in a range from 5 microns to 50 microns, although lesser or greater thicknesses may also be used. In some embodiments, the fan-out bonding pads 928 may be, or include, under bump metallurgy (UBM) structures. The configurations of the fan-out bonding pads 928 are not limited to be fan-out structures. Alternatively, the fan-out bonding pads 928 may be configured for microbump bonding (i.e., C2 bonding), and may have a thickness in a range from 30 microns to 100 microns, although lesser or greater thicknesses may also be used. In such an embodiment, the fan-out bonding pads 928 may be formed as an array of microbumps (such as copper pillars) having a lateral dimension in a range from 10 microns to 25 microns, and having a pitch in a range from 20 microns to 50 microns.

The fan-out bonding pads 928 and the second solder material portions 290 may be formed on the opposite side of the EMC matrix 910M and the two-dimensional array of sets of semiconductor dies (700, 800) relative to the redistribution structure layer. The redistribution structure layer includes a three-dimensional array of redistribution structures 920. Each redistribution structure 920 may be located within a respective unit area UA. Each redistribution structure 920 may include redistribution dielectric layers 922, redistribution wiring interconnects 924 embedded in the redistribution dielectric layers 922, and fan-out bonding pads 928. The fan-out bonding pads 928 may be located on an opposite side of the redistribution-side bonding structures 938 relative to the redistribution dielectric layers 922, and may be electrically connected to a respective one of the redistribution-side bonding structures 938.

Figure 8:
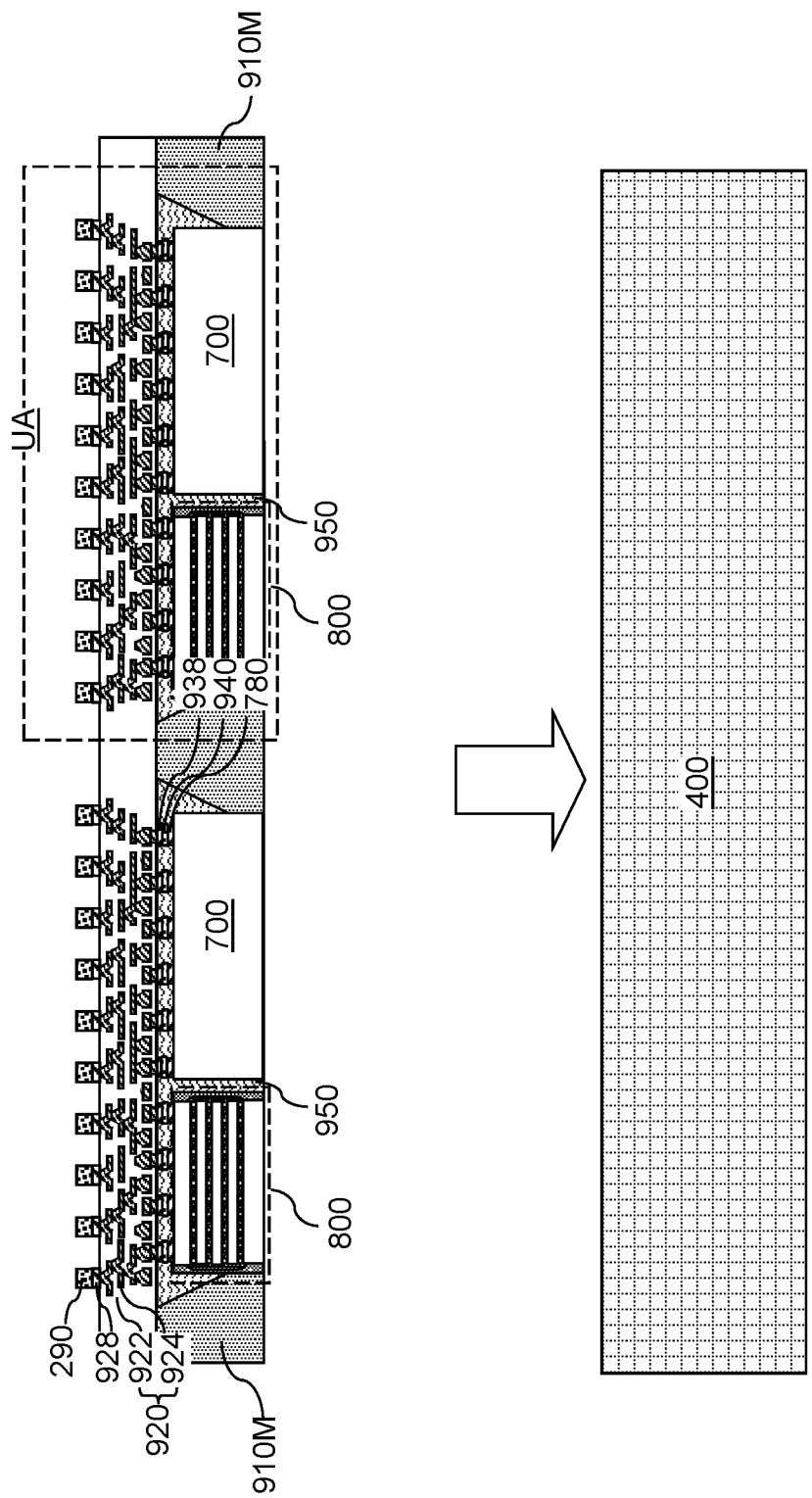
FIG. 8 is a vertical cross-sectional view of a region of the exemplary structure after detaching the second carrier substrate according to an embodiment of the present disclosure.

Referring to FIG. 8, the second adhesive layer 401 may be decomposed by ultraviolet radiation or by a thermal anneal at a debonding temperature. In embodiments in which the second carrier substrate 400 includes an optically transparent material and the second adhesive layer 401 includes an LTHC layer, the second adhesive layer 401 may be decomposed by irradiating ultraviolet light through the transparent carrier substrate. In embodiments in which the second adhesive layer 401 includes a thermally decomposing adhesive material, a thermal anneal process at a debonding temperature may be performed to detach the second carrier substrate 400 from the reconstituted wafer 900W.

Figure 9:
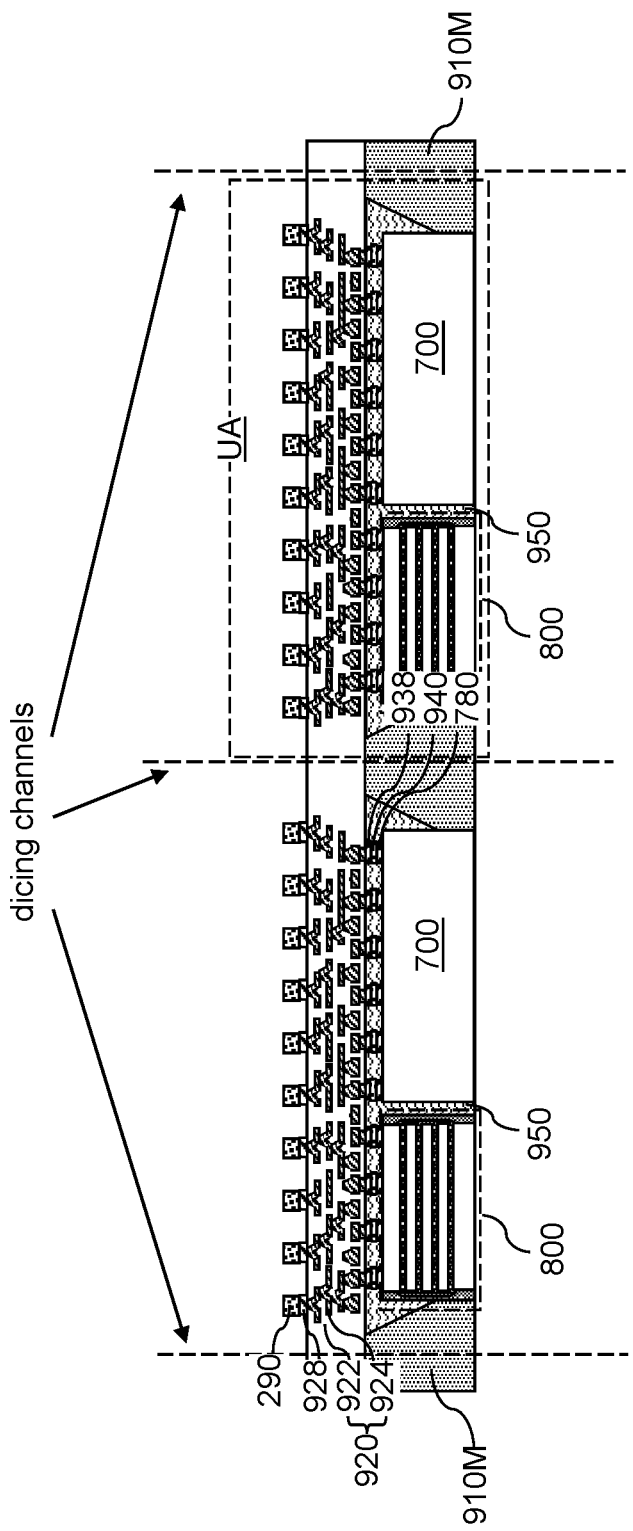
FIG. 9 is a vertical cross-sectional view of a region of the exemplary structure during dicing of a redistribution substrate and the EMC matrix according to an embodiment of the present disclosure.

Referring to FIG. 9, the reconstituted wafer 900W including the fan-out bonding pads 928 may be subsequently diced along dicing channels by performing a dicing process. The dicing channels correspond to the boundaries between neighboring pairs of unit area UA. Each diced unit from the reconstituted wafer 900W may include a fan-out package 900. In other words, each diced portion of the assembly of the two-dimensional array of sets of semiconductor dies (700, 800), the two-dimensional array of first underfill material portions 950, the EMC matrix 910M, and the two-dimensional array of redistribution structures 920 constitutes a fan-out package 900. Each diced portion of the EMC matrix 910M constitutes a molding compound die frame 910. Each diced portion of the redistribution structure layer (which includes the two-dimensional array of redistribution structures 920) constitutes a redistribution structure 920.

Figure 10A:
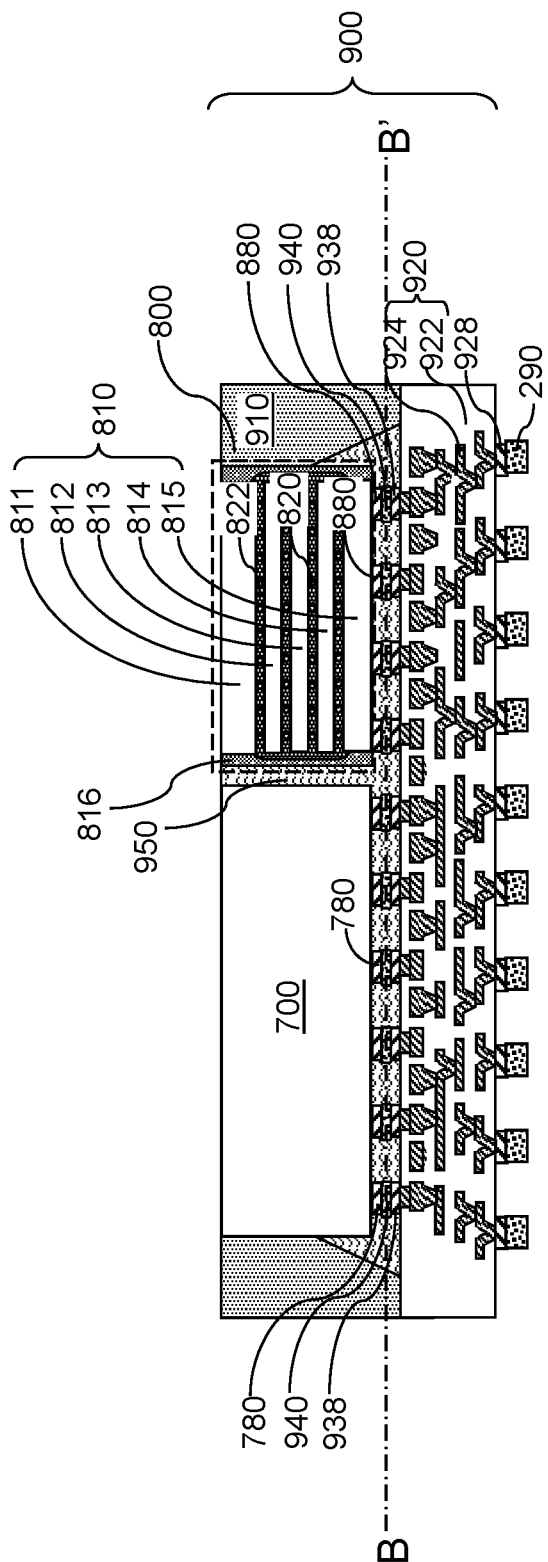
FIG. 10A is a vertical cross-sectional view of a fan-out package according to an embodiment of the present disclosure.
Figure 10B:
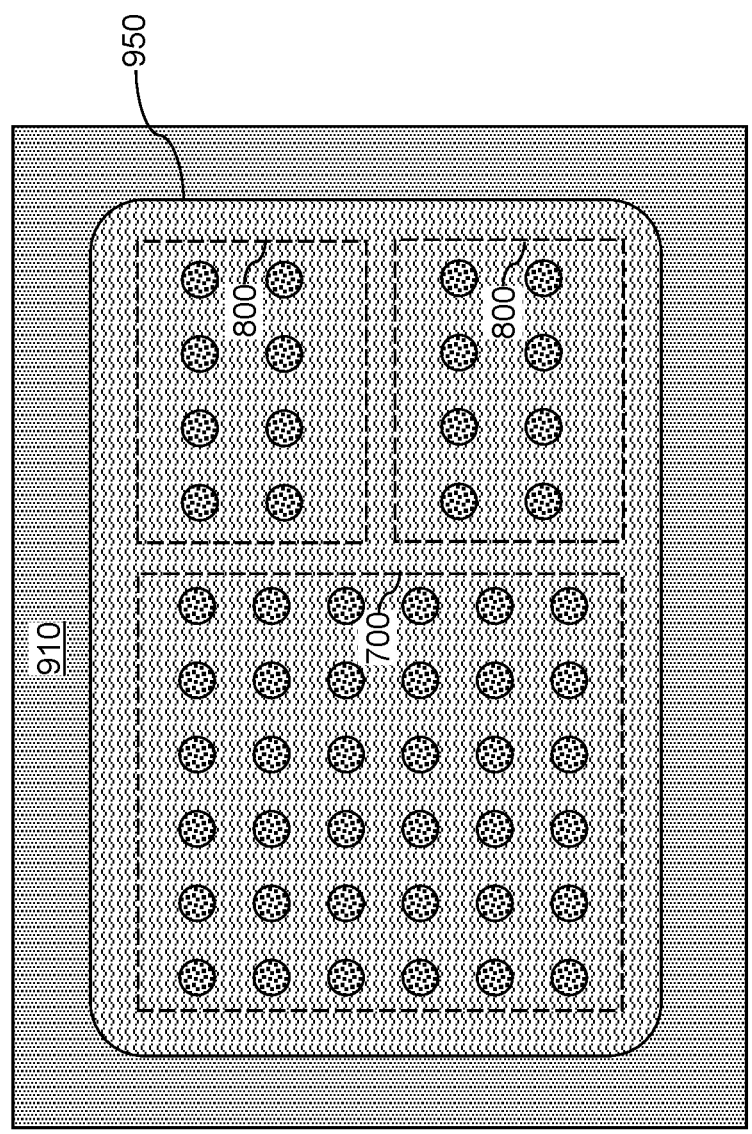
FIG. 10B is a horizontal cross-sectional view of the fan-out package along the horizontal plane B-B' of FIG. 10A.

Referring to FIGS. 10A and 10B, a fan-out package 900 obtained by dicing the exemplary structure at the processing steps of FIG. 9 is illustrated. The fan-out package 900 comprises a redistribution structure 920 including redistribution-side bonding structures 938, at least one semiconductor die (700, 800) comprising a respective set of die-side bonding structures (780, 880) that is attached to the redistribution-side bonding structures 938 through a respective set of first solder material portions 940, a first underfill material portion 950 laterally surrounding the redistribution-side bonding structures 938 and the die-side bonding structures (780, 880) of the at least one semiconductor die (700, 800).

The fan-out package 900 may comprise a molding compound die frame 910 laterally surrounding the at least one semiconductor die (700, 800) and comprising a molding compound material. In one embodiment, the molding compound die frame 910 may include sidewalls that are vertically coincident with sidewalls of the redistribution structure 920, i.e., located within same vertical planes as the sidewalls of the redistribution structure 920. Generally, the molding compound die frame 910 may be formed around the at least one semiconductor die (700, 800) after formation of the first underfill material portion 950 within each fan-out package 900. The molding compound material contacts a peripheral portion of a planar surface of the redistribution structure 920.

Figure 11A:
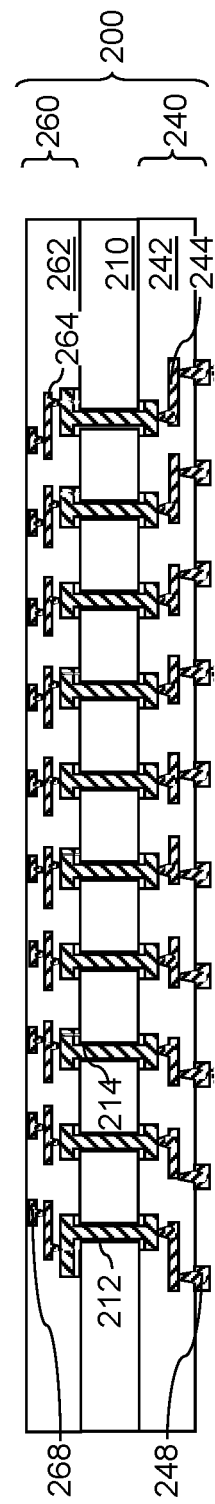
FIG. 11A is a vertical cross-sectional view of a packaging substrate according to an embodiment of the present disclosure.
Figure 11B:
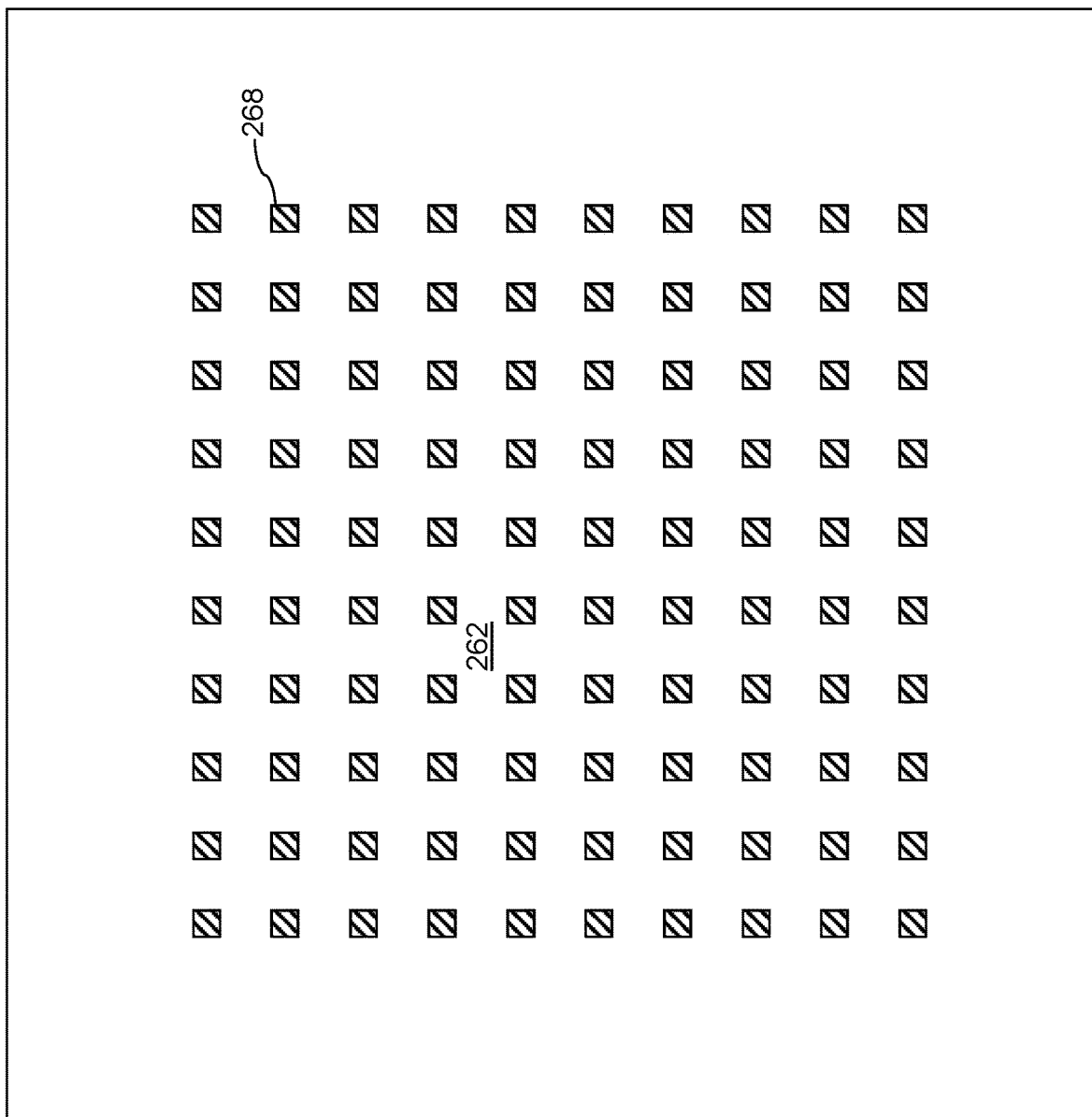
FIG. 11B is a top-down view of the packaging substrate of FIG. 11A.

Referring to FIGS. 11A and 11B, a packaging substrate 200 is provided. The packaging substrate 200 may be a cored packaging substrate including a core substrate 210, or a coreless packaging substrate that does not include a package core. Alternatively, the packaging substrate 200 may include a system-on-integrated packaging substrate (SoIS) including redistribution layers and/or dielectric interlayers, at least one embedded interposer (such as a silicon interposer). Such a system-integrated packaging substrate may include layer-to-layer interconnections using solder material portions, microbumps, underfill material portions (such as molded underfill material portions), and/or an adhesion film. While the present disclosure is described using an exemplary substrate package, it is understood that the scope of the present disclosure is not limited by any particular type of substrate package and may include an SoIS. The core substrate 210 may include a glass epoxy plate including an array of through-plate holes. An array of through-core via structures 214 including a metallic material may be provided in the through-plate holes. Each through-core via structure 214 may, or may not, include a cylindrical hollow therein.

Optionally, dielectric liners 212 may be used to electrically isolate the through-core via structures 214 from the core substrate 210.

The packaging substrate 200 may include board-side surface laminar circuit (SLC) 240 and a chip-side surface laminar circuit (SLC) 260. The board-side SLC may include board-side insulating layers 242 embedding board-side wiring interconnects 244. The chip-side SLC 260 may include chip-side insulating layers 262 embedding chip-side wiring interconnects 264. The board-side insulating layers 242 and the chip-side insulating layers 262 may include a photosensitive epoxy material that may be lithographically patterned and subsequently cured. The board-side wiring interconnects 244 and the chip-side wiring interconnects 264 may include copper that may be deposited by electroplating within patterns in the board-side insulating layers 242 or the chip-side insulating layers 262.

In one embodiment, the packaging substrate 200 includes a chip-side surface laminar circuit 260 comprising chip-side wiring interconnects 264 connected to an array of chip-side bonding pads 268 that may be bonded to the array of second solder material portions 290, and a board-side surface laminar circuit 240 including board-side wiring interconnects 244 connected to an array of board-side bonding pads 248. The array of board-side bonding pads 248 is configured to allow bonding through solder balls. The array of chip-side bonding pads 268 may be configured to allow bonding through C4 solder balls. Generally, any type of packaging substrate 200 may be used. While the present disclosure is described using an embodiment in which the packaging substrate 200 includes a chip-side surface laminar circuit 260 and a board-side surface laminar circuit 240, embodiments are expressly contemplated herein in which one of the chip-side surface laminar circuit 260 and the board-side surface laminar circuit 240 is omitted, or is replaced with an array of bonding structures such as microbumps. In an illustrative example, the chip-side surface laminar circuit 260 may be replaced with an array of microbumps or any other array of bonding structures.

Figure 12A:
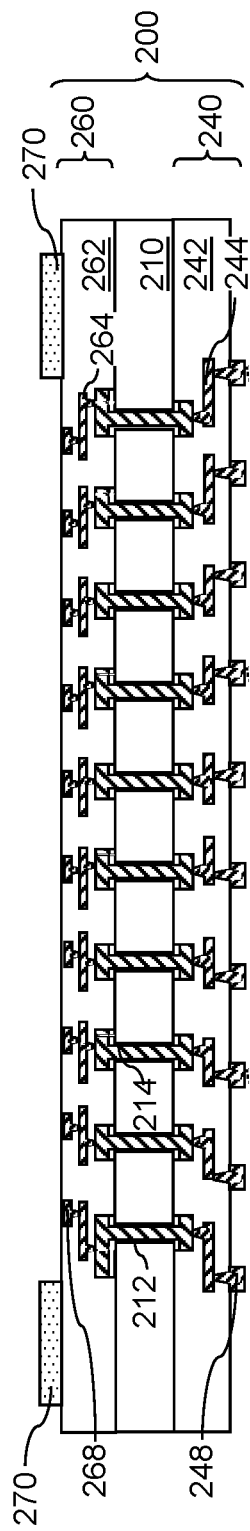
FIG. 12A is a vertical cross-sectional view of the packaging substrate after formation of a cushioning film according to an embodiment of the present disclosure.
Figure 12B:
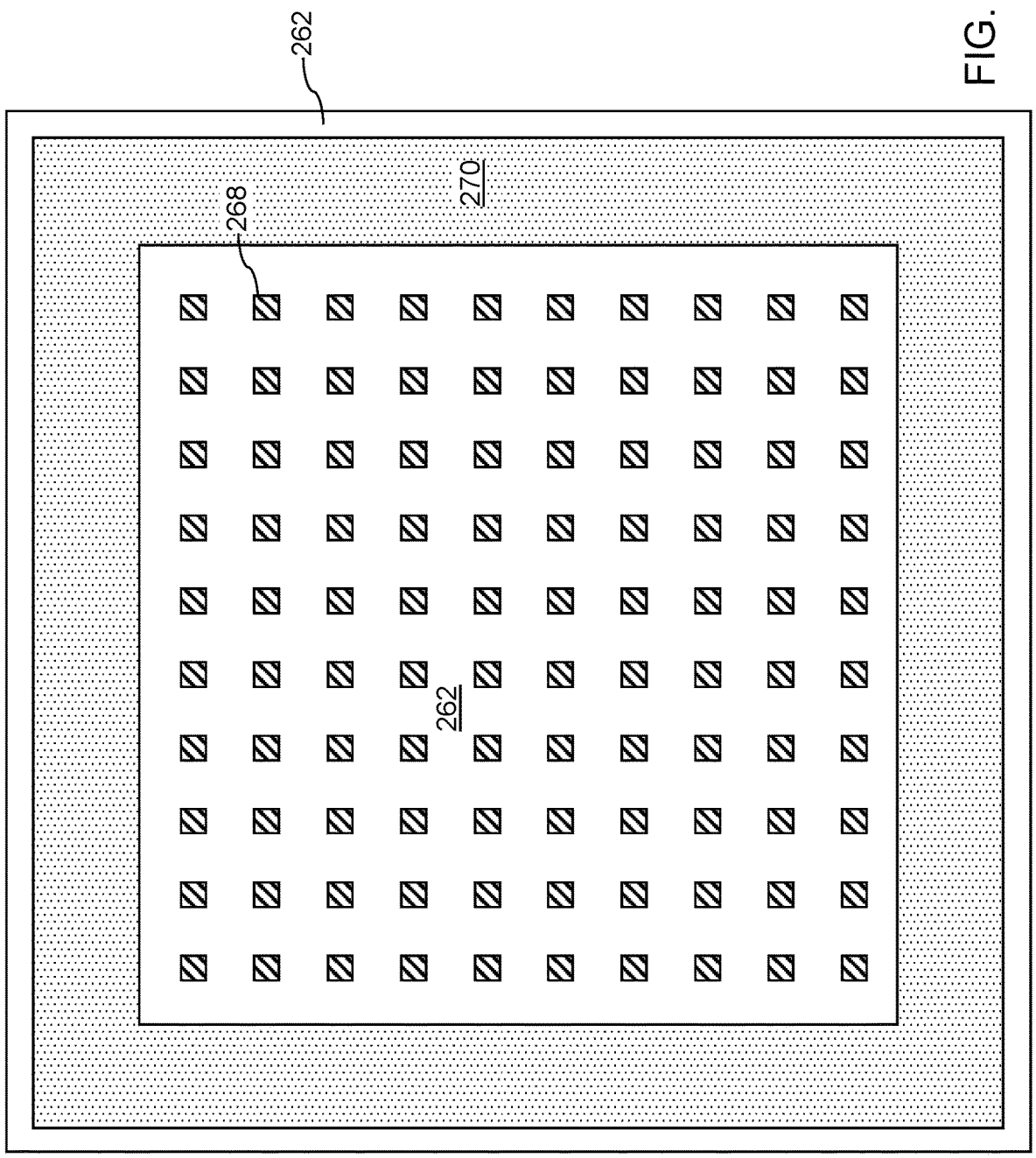
FIG. 12B is a top-down view of the packaging substrate of FIG. 12A.

Referring to FIGS. 12A and 12B and according to an aspect of the present disclosure, at least one cushioning film 270 may be formed on a top surface of a packaging substrate 200, which may be a physically exposed horizontal planar surface of the chip-side insulating layers 262. The at least one cushioning film 270 may comprise a single cushioning film 270, or may comprise a plurality of cushioning films 270. The at least one cushioning film 270 comprises, and/or consists essentially of, a cushioning material. The at least one cushioning film 270 may be formed by depositing a continuous cushioning material layer on the top surface of the packaging substrate 200, and by patterning the continuous cushioning material layer into the at least one cushioning film 270. The continuous cushioning material layer may be formed by spin-coating or chemical vapor deposition, and may be patterned by applying and patterning a photoresist thereabove, and by transferring the pattern in the photoresist layer through the continuous cushioning material layer by etching unmasked portions of the continuous cushioning material layer. Alternatively, the continuous cushioning material layer may be photosensitive, and may be directly patterned by lithographic exposure and development.

The cushioning material of the at least one cushioning film 270 may include a material that absorbs mechanical stress that is subsequently applied to the fan-out package 900, and especially to corner regions of the fan-out package 900. The cushioning material may include a material that may absorb mechanical stress better than a second underfill material to be subsequently applied between the packaging substrate 200 and the fan-out package 900 that is subsequently bonded to the packaging substrate 200. For example, the cushioning material may have a first Young's modulus, and the second underfill material to be subsequently used may have a second Young's modulus that is higher than the first Young's modulus. Thus, the cushioning material deforms more easily than the second underfill material to be subsequently used.

Further, the cushioning material may include a material providing more thermal expansion than the second underfill material to be subsequently used. In one embodiment, the cushioning material of the at least one cushioning film 270 may comprise, and/or may consist essentially of, a material having a first coefficient of thermal expansion at room temperature (i.e., at 20 degrees Celsius), and the second underfill material to be subsequently used may comprise, and/or may consist essentially of, a material having a second coefficient of thermal expansion at room temperature that is lower than the first coefficient of thermal expansion at room temperature.

The at least one cushioning film 270 may include, and/or may consist essentially of, a material having a Young's modulus that is lower than a Young's modulus of a second underfill material to be subsequently applied between the packaging substrate 200 and the fan-out package 900 as provided at the processing steps of FIGS. 10A and 10B. In an illustrative example, the at least one cushioning film 270 may comprise a polymer material or an epoxy-based material. In one embodiment, the at least one cushioning film 270 may comprise, and/or may consist essentially of, a material having a Young's modulus less than 4.0 GPa, and/or less than 2.0 GPa. In one embodiment, the at least one cushioning film 270 may comprise, and/or may consist essentially of, a material selected from polyimide (PI), polybenzoxazole (PBO), benzocyclobutene (BCB), and silicone. In one embodiment, the at least one cushioning film 270 may comprise, and/or may consist essentially of, a material having a Young's modulus less than 200 MPa.

In one embodiment, the at least one cushioning film 270 may have a uniform thickness throughout. In one embodiment, the uniform thickness is less than a maximum height of an array of solder material portions to be subsequently used to attach the fan-out package 900 to the packaging substrate 200. In one embodiment, the thickness of the at least one cushioning film 270 may be in a range from 10% to 50% of the height of solder material portions to be subsequently used to attach the fan-out package 900 to the packaging substrate 200. In an illustrative example, the thickness of the at least one cushioning film 270 may be in a range from 3 microns to 50 microns, such as from 6 microns to 25 microns and/or from 9 microns to 20 microns, although lesser and greater thicknesses may also be used.

In one embodiment, the at least one cushioning film 270 within each unit area UA may comprise a single rectangular frame-shaped cushioning film 270 having a rectangular outer periphery and a rectangular inner periphery. In this embodiment, an opening within the cushioning film 270 may have a rectangular shape such that a pair of lengthwise sidewalls is parallel to the first horizontal direction hd1, and a pair of widthwise sidewalls is parallel to the second horizontal direction hd2.

Figure 13:
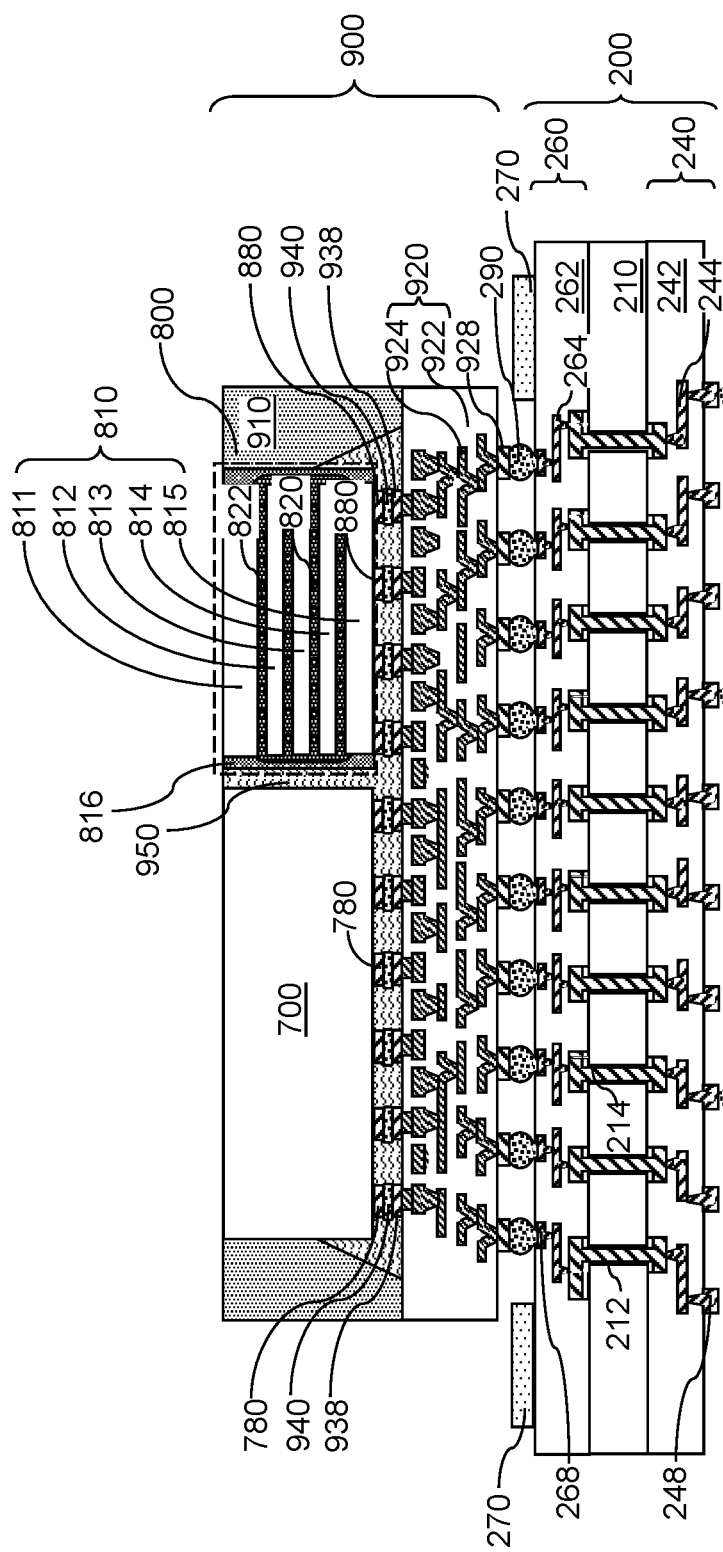
FIG. 13 is a vertical cross-sectional view of an exemplary structure after attaching the fan-out package to the packaging substrate according to an embodiment of the present disclosure.

Referring to FIG. 13, the fan-out package 900 may be disposed over the packaging substrate 200 with an array of the second solder material portions 290 therebetween. In embodiments in which the second solder material portions 290 are formed on the fan-out bonding pads 928 of the fan-out package 900, the second solder material portions 290 may be disposed on the chip-side bonding pads 268 of the packaging substrate 200. A reflow process may be performed to reflow the second solder material portions 290, thereby inducing bonding between the fan-out package 900 and the packaging substrate 200. Each second solder material portion 290 may be bonded to a respective one of the fan-out bonding pads 928 and to a respective one of the chip-side bonding pads 268. In one embodiment, the second solder material portions 290 may include C4 solder balls, and the fan-out package 900 may be attached to the packaging substrate 200 through an array of C4 solder balls. Generally, the fan-out package 900 may be bonded to the packaging substrate 200 such that the redistribution structure 920 is bonded to the packaging substrate 200 by an array of solder material portions (such as the second solder material portions 290).

Figure 14A:
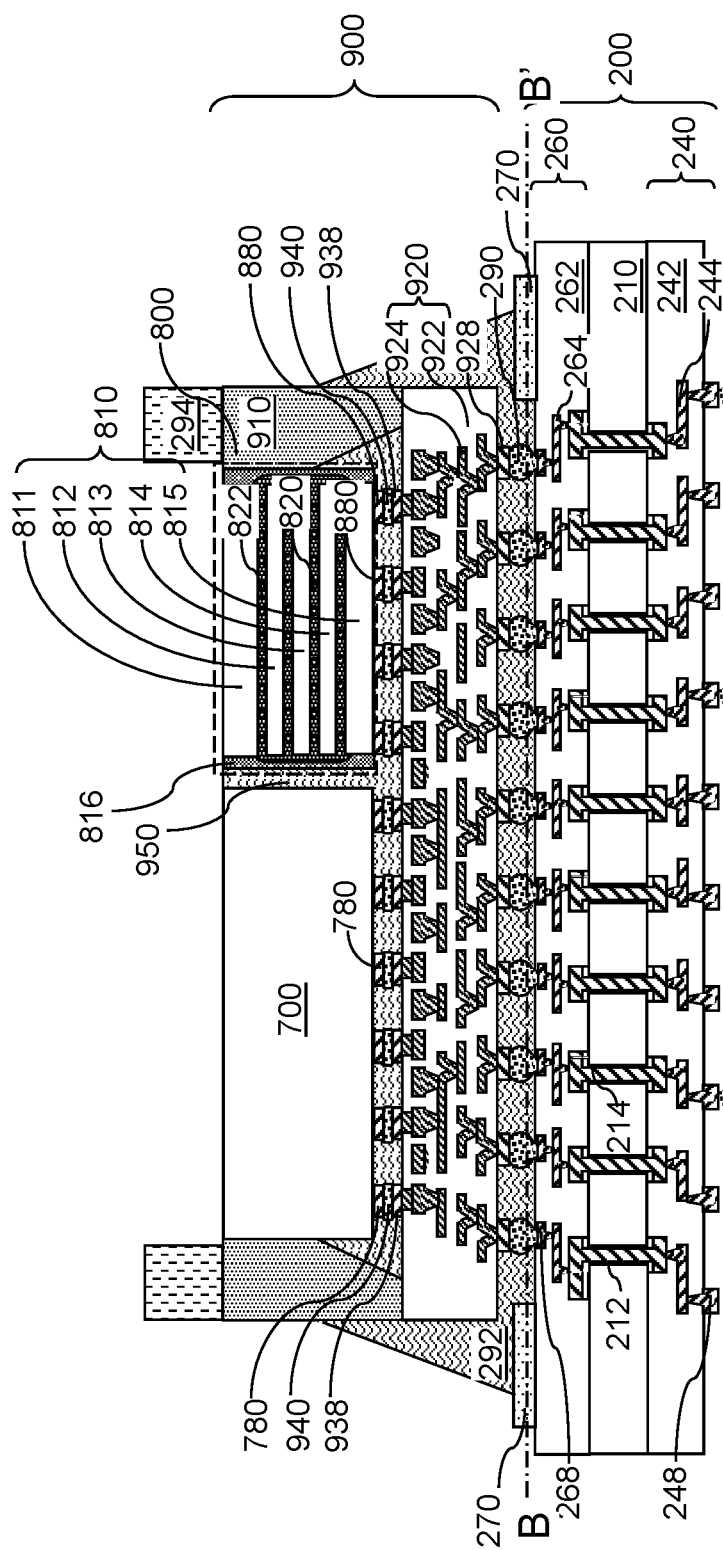
FIG. 14A is a vertical cross-sectional view of the exemplary structure after formation of a second underfill material portion according to an embodiment of the present disclosure.
Figure 14B:
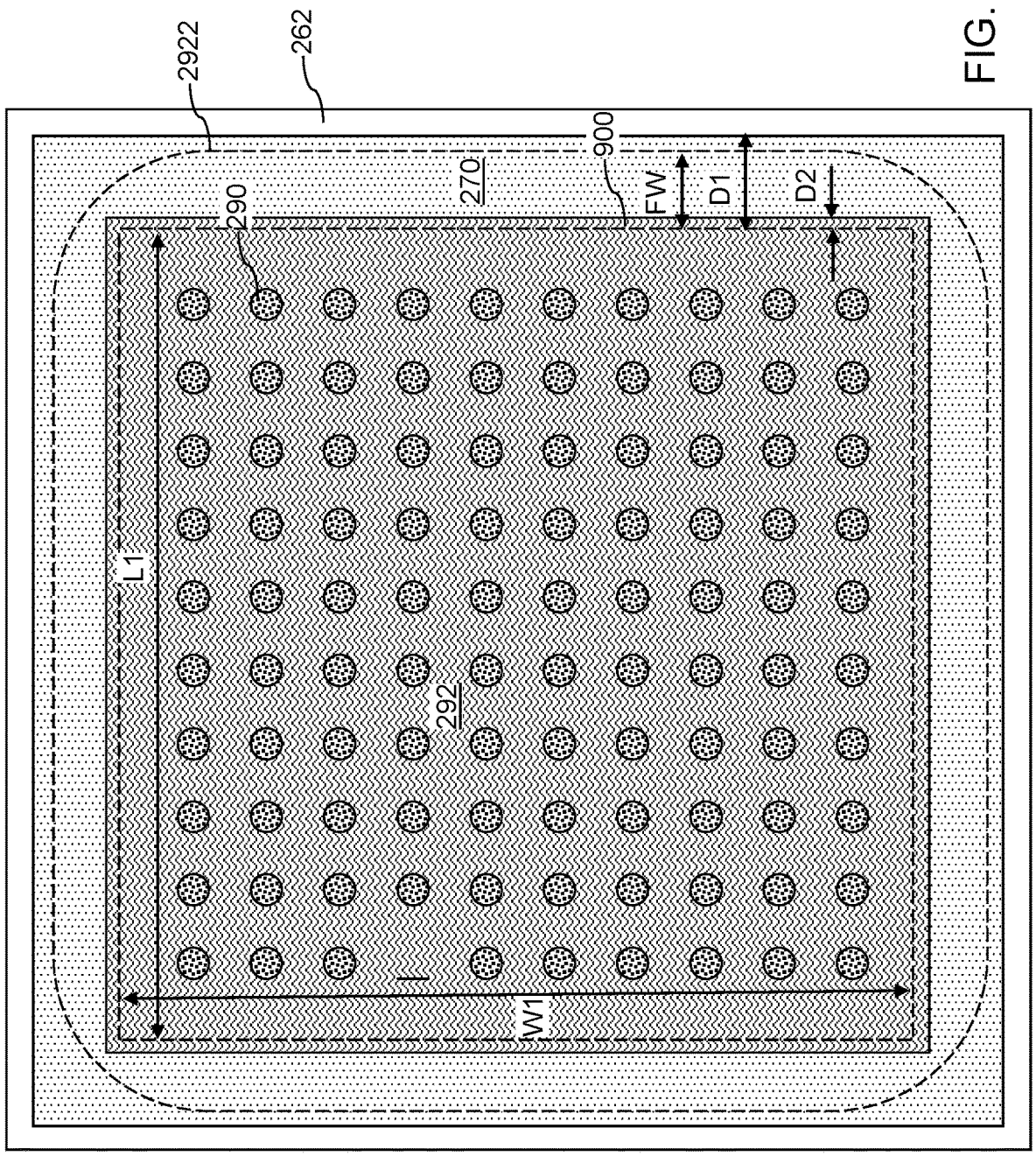
FIG. 14B is a horizontal cross-sectional view of the exemplary structure along the horizontal plane B-B' of FIG. 14A.

Referring to FIGS. 14A and 14B, a second underfill material portion 292 may be formed around the second solder material portions 290 by applying and shaping a second underfill material. The second underfill material portion 292 may be formed by injecting the second underfill material around the array of second solder material portions 290 after the second solder material portions 290 are reflowed. Any known underfill material application method may be used, which may be, for example, the capillary underfill method, the molded underfill method, or the printed underfill method.

The second underfill material portion 292 may be formed between the redistribution structure 920 and the packaging substrate 200. According to an aspect of the present disclosure, the second underfill material portion 292 may be formed directly on each sidewall of the molding compound die frame 910 and directly on segments of a top surface and at least one sidewall of one, and/or each, of the at least one cushioning film 270. The second underfill material portion 292 may contact each of the second solder material portions 290 (which may be C4 solder balls or C2 solder caps), and may contact vertical sidewalls of the fan-out package 900. The second underfill material portion laterally surrounds, and contacts, the array of second solder material portions 290 and the fan-out package 900.

Optionally, a stabilization structure 294, such as a cap structure or a ring structure, may be attached to the assembly of the fan-out package 900 and the packaging substrate 200 to reduce deformation of the assembly during subsequent processing steps and/or during usage of the assembly.

In one embodiment, the fan-out package 900 comprises a molding compound die frame 910 that laterally surrounds the at least one semiconductor die (700, 800) and contacting a peripheral portion of a top surface of the redistribution structure 920. The second underfill material portion 292 may be formed directly on sidewalls of the molding compound die frame 910. In one embodiment, the second underfill material portion 292 covers a first portion of each of the at least one cushioning film 270, and does not cover a second portion of each of the at least one cushioning film 270 that is located outside the first portion of each of the at least one cushioning film 270.

In one embodiment, the fan-out package 900 may have a rectangular horizontal cross-sectional shape having a first length L1 along a first horizontal direction and having a first width W1 along a second horizontal direction that is perpendicular to the first horizontal direction. In one embodiment, the outer periphery 2922 of the second underfill material portion 292 that defines the outermost extent of the second underfill material portion 292 may be equidistant, or may be substantially equidistant, from the sidewalls of the fan-out package 900. The lateral distance (i.e., the horizontal distance) between the outer periphery 2922 of the second underfill material portion 292 and the most proximal one of the sidewall of the fan-out package 900 is herein referred to as a filet width FW, which may be in a range from 3 microns to 30 microns, such as from 5 microns to 20 microns and/or from 8 microns to 15 microns, although lesser and greater lateral dimensions may also be used.

In one embodiment, the at least one cushioning film 270 comprises a single rectangular frame-shaped cushioning film 270 having a rectangular outer periphery and a rectangular inner periphery, the lateral distance between the rectangular outer periphery of the cushioning film 270 and a most proximal sidewall of the fan-out package 900 is herein referred to as a first lateral offset distance D1. The first lateral offset distance D1 may be greater than the filet width FW. For example, the first lateral offset distance D1 may be in a range from 4 microns to 60 microns, such as from 6 microns to 40 microns and/or from 10 microns to 30 microns, although lesser and greater lateral dimensions may also be used.

The lateral distance between the rectangular inner periphery of the cushioning film 270 and a most proximal sidewall of the fan-out package 900 is herein referred to as a second lateral offset distance D2. The second lateral offset distance D2 may be less than the fillet width FW. For example, the second lateral offset distance D2 may be in a range from 0.01 micron to 20 microns, such as from 1 microns to 15 microns and/or from 2 microns to 10 microns, although lesser and greater lateral dimensions may also be used. In one embodiment, the entirety of the outer periphery 2922 of the second underfill material portion 292 may be located on a top surface of the cushioning film 270. In one embodiment, the entirety of the outer periphery 2922 of the second underfill material portion 292 may be laterally offset inward from the outer sidewalls of the cushioning film 270, and may be laterally offset outward from the inner sidewalls of the cushioning film 270.

Referring to FIG. 15A, a first alternative embodiment of the exemplary structure is illustrated. An entirety of the at least one cushioning film 270 (which may be a rectangular frame-shaped cushioning film 270) may be located outside a periphery of an area of the fan-out package 900 (i.e., outside the area defined by the outer sidewalls of the molding compound die frame 910) in a plan view along a vertical direction. The vertical direction is the direction that is perpendicular to horizontal surfaces of the packaging substrate 200, such as the direction that is perpendicular to a horizontal plane including bonding surfaces of the chip-side bonding pads 268.

Figure 15B:
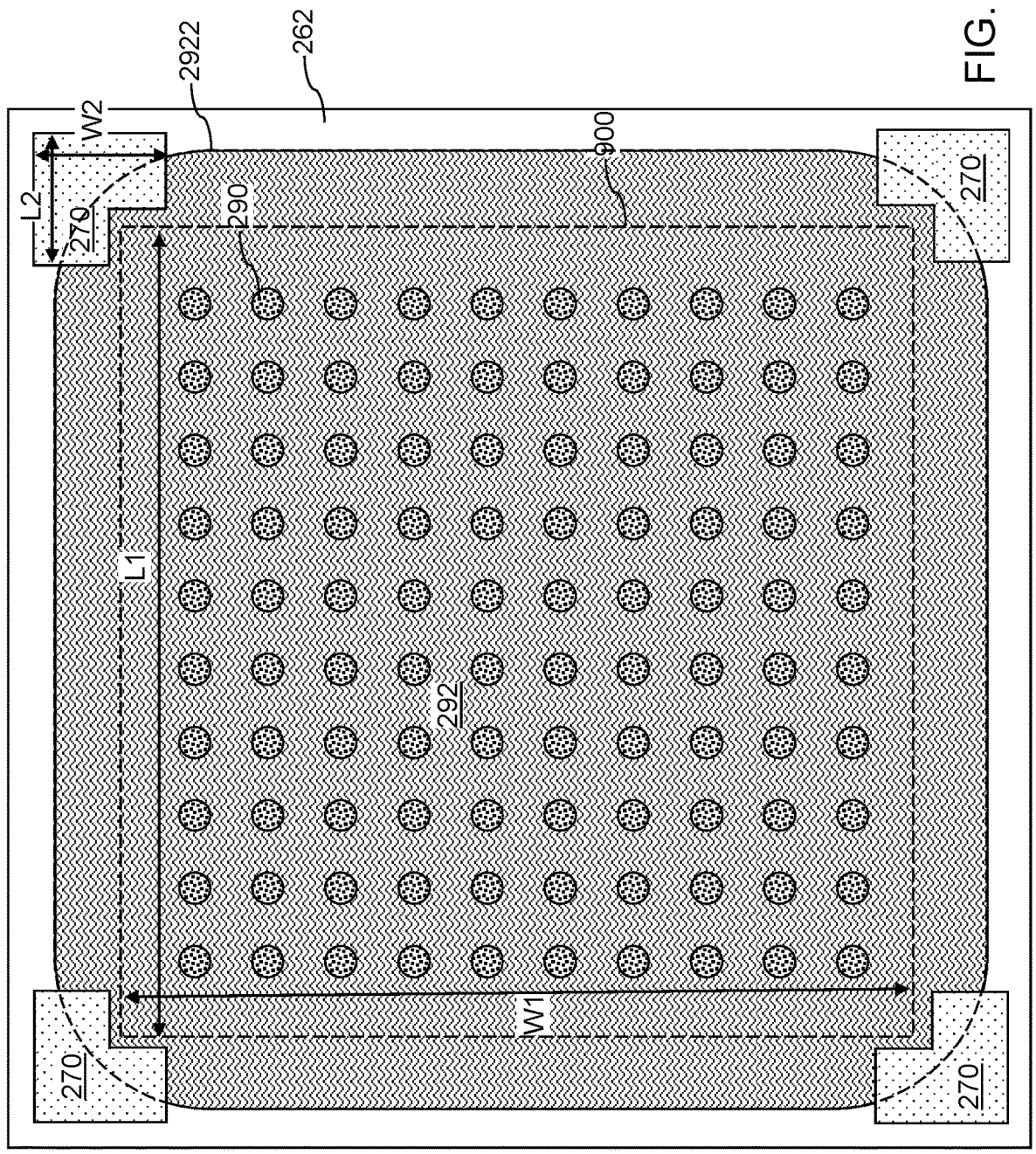
FIG. 15B is a horizontal cross-sectional view of a second alternative embodiment of the exemplary structure along a horizontal plane that corresponds to the horizontal plane B-B' of FIG. 14A.

Referring to FIG. 15B, a second alternative embodiment of the exemplary structure is illustrated. The at least one cushioning film 270 may comprises a plurality of L-shaped cushioning films 270 located outside corner regions of the fan-out package 900 and not having an areal overlap with the fan-out package 900 in a plan view along the vertical direction. Each L-shaped cushioning film 270 may have a maximum length along a lengthwise direction, which is herein referred to as a second length L2. The ratio of the second length L2 to the first length L1 may be in a range from 0.001 to 0.5, such as from 0.05 to 0.3, although lesser and greater ratios may also be used. Each L-shaped cushioning film 270 may have a maximum width along a widthwise direction, which is herein referred to as a second width W2. The ratio of the second width W2 to the first width W1 may be in a range from 0.001 to 0.5, such as from 0.05 to 0.3, although lesser and greater ratios may also be used.

Figure 15C:
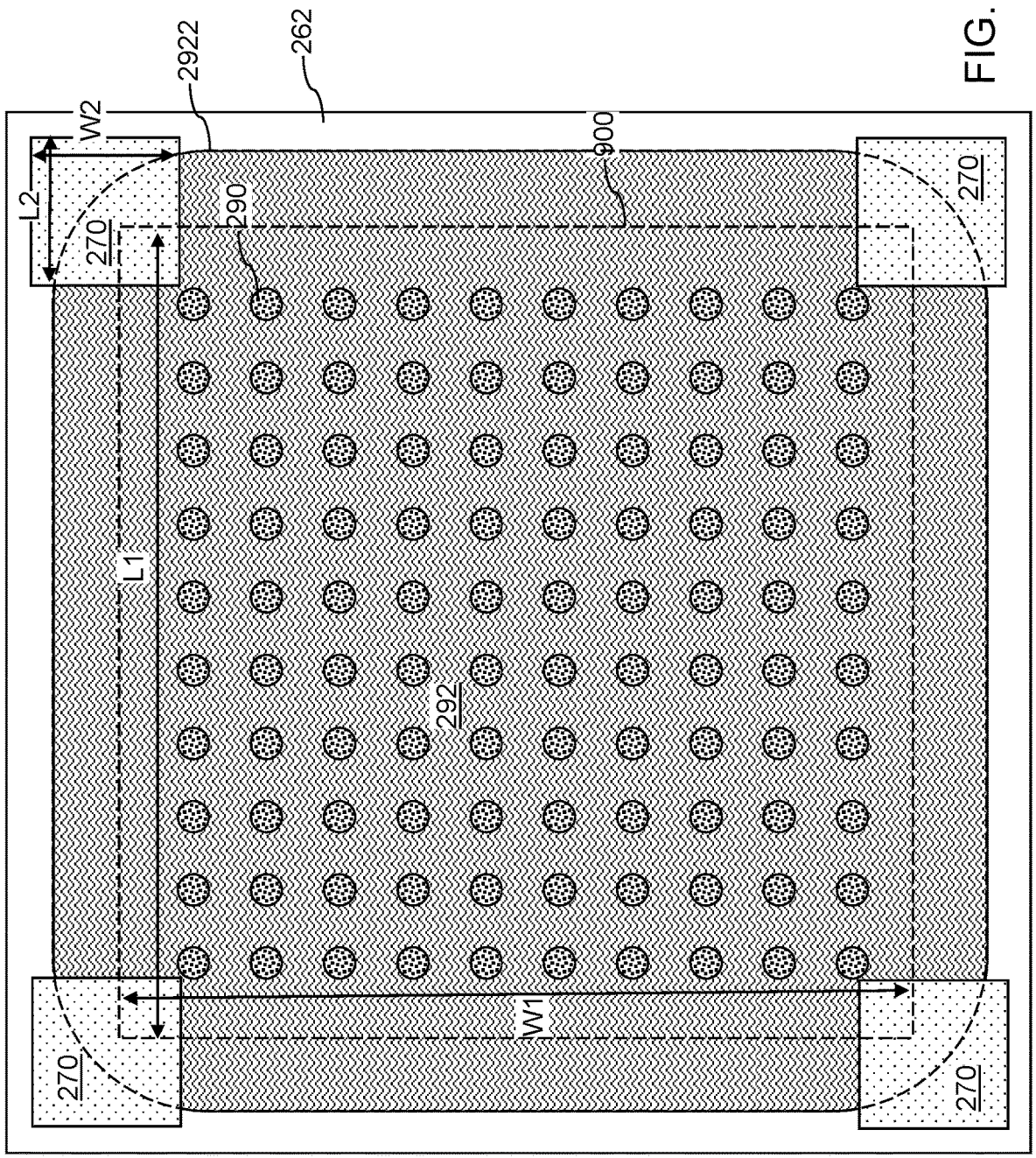
FIG. 15C is a horizontal cross-sectional view of a third alternative embodiment of the exemplary structure along a horizontal plane that corresponds to the horizontal plane B-B' of FIG. 14A.

Referring to FIG. 15C, a third alternative embodiment of the exemplary structure is illustrated. The at least one cushioning film 270 may comprise a plurality of rectangular cushioning films 270 located about corner regions of the fan-out package 900 and having a respective areal overlap with the fan-out package 900 in a plan view along a vertical direction. Each rectangular-shaped cushioning film 270 may have a maximum length along a lengthwise direction, which is herein referred to as a second length L2. The ratio of the second length L2 to the first length L1 may be in a range from 0.001 to 0.5, such as from 0.05 to 0.3, although lesser and greater ratios may also be used. Each L-shaped cushioning film 270 may have a maximum width along a widthwise direction, which is herein referred to as a second width W2. The ratio of the second width W2 to the first width W1 may be in a range from 0.001 to 0.5, such as from 0.05 to 0.3, although lesser and greater ratios may also be used.

Referring collectively to FIGS. 14A, 14B, 15A, 15B, and 15C and according to various embodiments of the present disclosure, the second underfill material portion 292 may contact a first portion of a top surface of one, or each, of the at least one cushioning film 270, and a second portion of the top surface of one, or each, of the at least one cushioning film 270 is not contacted by the second underfill material portion 292.

In some embodiments, the entirety of each bottom surface of the at least one cushioning film 270 may be in contact with a horizontal top surface of the packaging substrate 200, and each of the at least one cushioning film 270 may include a respective first sidewall that contacts the second underfill material portion 292 and a respective second sidewall that does not contact the second underfill material portion 292 and is physically exposed to an ambient gas, such as atmosphere.

In one embodiment, a first portion of the at least one cushioning film 270 has an areal overlap with the fan-out package 900 in a plan view along a vertical direction that is perpendicular to a horizontal plane including bonding surfaces of the chip-side bonding pads 268; and a second portion of the at least one cushioning film 270 is located outside a periphery of an area of the fan-out package in the plan view as illustrated in FIG. 15A.

The at least one cushioning film 270 comprises a frame-shaped cushioning film 270 comprising an inner periphery and an outer periphery that laterally surrounds the inner periphery and is laterally spaced from the inner periphery; and the inner periphery laterally surrounds the array of second solder material portions 290.

In one embodiment, the second underfill material portion 292 contacts sidewalls of the redistribution structure 920 and sidewalls of the molding compound die frame 910.

In one embodiment, the at least one cushioning film 270 has a uniform thickness; and each of the at least one cushioning film 270 comprises a portion that is located outside a periphery of an area of the fan-out package 900 in a plan view along a vertical direction that is perpendicular to a horizontal plane including a horizontal surface of the packaging substrate 200 that is proximal to the fan-out package 900.

Figure 16:
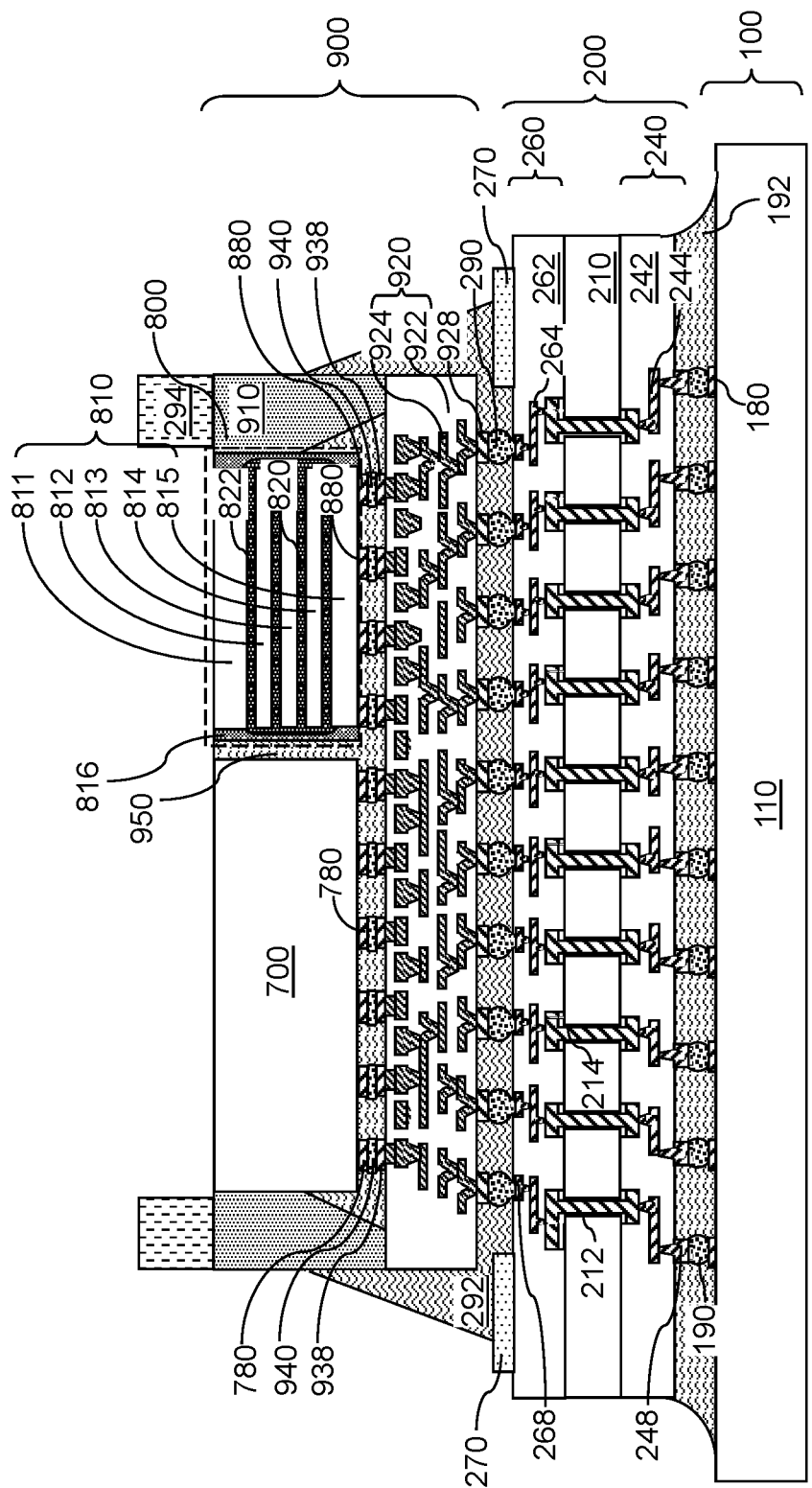
FIG. 16 is a vertical cross-sectional view of the exemplary structure after the packaging substrate is attached to a printed circuit board (PCB) according to an embodiment of the present disclosure.

Referring to FIG. 16, a printed circuit board (PCB) 100 including a PCB substrate 110 and PCB bonding pads 180 may be provided. The PCB 100 includes a printed circuitry (not shown) at least on one side of the PCB substrate 110. An array of solder joints 190 may be formed to bond the array of board-side bonding pads 248 to the array of PCB bonding pads 180. The solder joints 190 may be formed by disposing an array of solder balls between the array of board-side bonding pads 248 and the array of PCB bonding pads 180, and by reflowing the array of solder balls. An underfill material portion 192 may be formed around the solder joints 190 by applying and shaping an underfill material. The packaging substrate 200 is attached to the PCB 100 through the array of solder joints 190.

Figure 17:
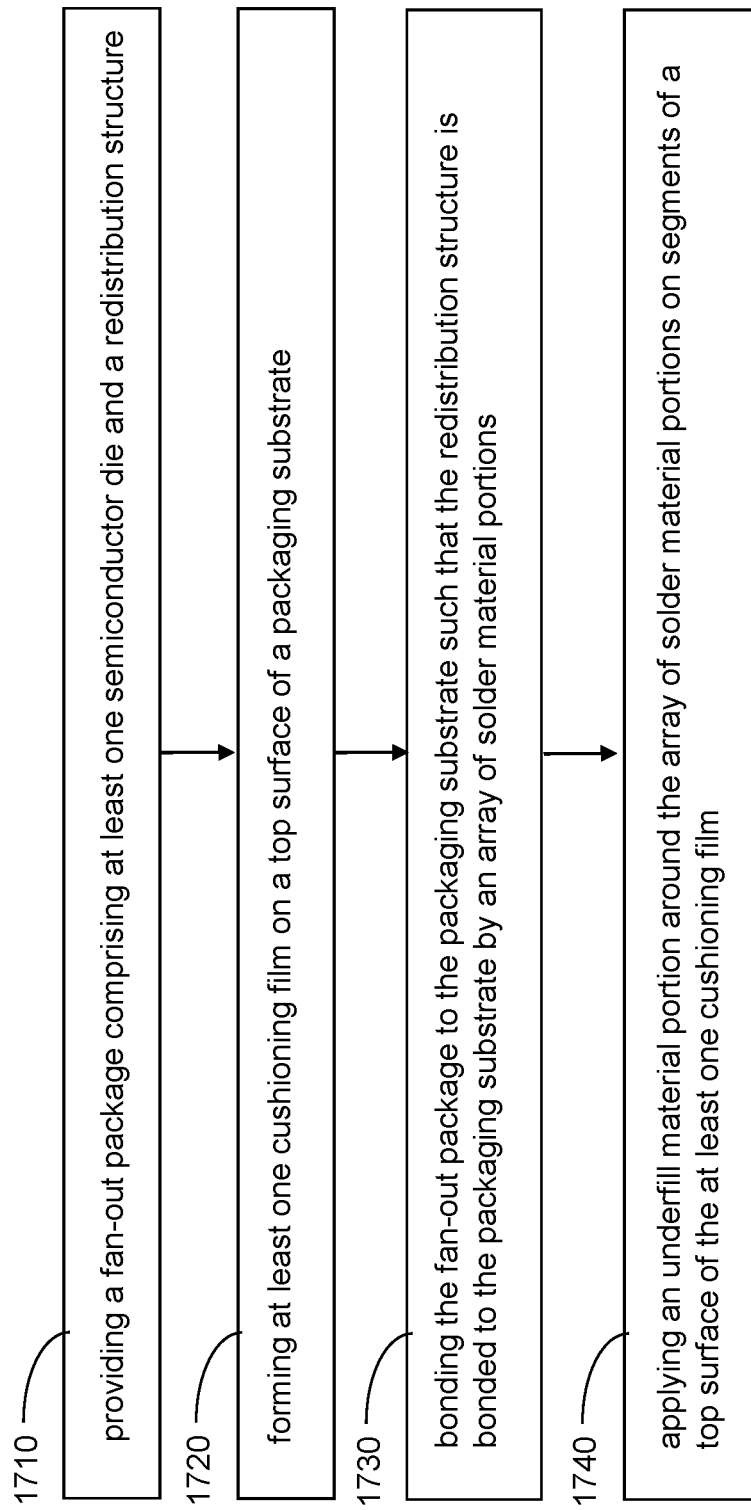
FIG. 17 is a flowchart illustrating steps for forming an exemplary structure according to an embodiment of the present disclosure.

Referring to FIG. 17, a flowchart illustrates steps for forming an exemplary structure according to an embodiment of the present disclosure.

Referring to step 1710 and FIGS. 1A-10B, a fan-out package 900 comprising at least one semiconductor die (700, 800) and a redistribution structure 920 is provided.

Referring to step 1720 and FIGS. 11A-12B, at least one cushioning film 270 may be formed on a top surface of a packaging substrate 200.

Referring to step 1730 and FIG. 13, the fan-out package 900 may be bonded to the packaging substrate 200 such that the redistribution structure 920 is bonded to the packaging substrate 200 by solder material portions (such as the second solder material portions 290).

Referring to step 1740 and FIGS. 14A, 14B, 15A-15C, and 16, an underfill material portion (such as the second underfill material portion 292) may be applied around the solder material portions on segments of a top surface of the at least one cushioning film 270.

In one embodiment, the fan-out package 900 may include a molding compound die frame 910 that laterally surrounds the at least one semiconductor die (700, 800) and may contact a peripheral portion of a top surface of the redistribution structure 920; and the underfill material portion 292 may be formed directly on sidewalls of the molding compound die frame 910. In one embodiment, the underfill material portion 292 may cover a first portion of each of the at least one cushioning film 270 and does not cover a second portion of each of the at least one cushioning film 270 that is located outside the first portion of each of the at least one cushioning film 270. In one embodiment, the at least one cushioning film 270 may have a Young's modulus that is lower than a Young's modulus of the underfill material portion 292. In one embodiment, the at least one cushioning film 270 may be formed by depositing a continuous cushioning material layer on the top surface of the packaging substrate 200 and patterning the continuous cushioning material layer into the at least one cushioning film 270.

Referring to all drawings and according to various embodiments of the present disclosure, a semiconductor structure is provided, which may include: a fan-out package 900 that may include at least one semiconductor die (700, 800), a redistribution structure 920 that may include fan-out bonding pads 928, and a first underfill material portion 950 located between the at least one semiconductor die (700, 800) and the redistribution structure 920; a packaging substrate 200 that may include chip-side bonding pads 268; solder material portions (such as the second solder material portions 290) bonded to the chip-side bonding pads 268 and the fan-out bonding pads 928; a second underfill material portion 292 laterally surrounding the solder material portions; and at least one cushioning film 270 located on the packaging substrate 200 and contacting the second underfill material portion 292 and having a Young's modulus that is lower than a Young's modulus of the second underfill material portion.

In one embodiment, the at least one cushioning film 270 has a uniform thickness. In one embodiment, the uniform thickness is less than a maximum height of the solder material portions (such as the second solder material portions 290) along a vertical direction that is perpendicular to a horizontal plane including bonding surfaces of the chip-side bonding pads 268. In one embodiment, the at least one cushioning film 270 may include a material selected from polyimide (PI), polybenzoxazole (PBO), benzocyclobutene (BCB), and silicone. In one embodiment, the second underfill material portion 292 may contact a first portion of a top surface of the at least one cushioning film 270, and a second portion of the top surface of the at least one cushioning film 270 is not contacted by the second underfill material portion 292. In one embodiment, an entirety of the at least one cushioning film 270 may be located outside a periphery of an area of the fan-out package 900 in a plan view along a vertical direction that is perpendicular to a horizontal plane including bonding surfaces of the chip-side bonding pads 268. In one embodiment, an entirety of each bottom surface of the at least one cushioning film 270 may be in contact with a top surface of the packaging substrate 200; and each of the at least one cushioning film 270 may include a respective first sidewall that contacts the second underfill material portion 292 and a respective second sidewall that does not contact the second underfill material portion 292 and may be physically exposed to an ambient gas. In one embodiment, a first portion of the at least one cushioning film 270 has an areal overlap with the fan-out package 900 in a plan view along a vertical direction that is perpendicular to a horizontal plane including bonding surfaces of the chip-side bonding pads 268; and a second portion of the at least one cushioning film 270 is located outside a periphery of an area of the fan-out package 900 in the plan view. In one embodiment, the at least one cushioning film 270 may include a frame-shaped cushioning film that includes an inner periphery and an outer periphery that laterally surrounds the inner periphery and is laterally spaced from the inner periphery; and the inner periphery laterally surrounds the solder material portions (such as the second solder material portions 290). In one embodiment, the at least one cushioning film 270 may include a plurality of L-shaped cushioning films located outside corner regions of the fan-out package and not having an areal overlap with the fan-out package in a plan view along a vertical direction that is perpendicular to a horizontal plane including bonding surfaces of the chip-side bonding pads.

Referring to all drawings and according to various embodiments of the present disclosure, a semiconductor structure is provided, which may include: a fan-out package 900 that may include at least one semiconductor die (700, 800), a molding compound die frame 910 that laterally surrounds the at least one semiconductor die (700, 800), a redistribution structure 920 that may include fan-out bonding pads 928, and a first underfill material portion 950 located on the redistribution structure 920 and contacting sidewalls of the at least one semiconductor die (700, 800); a packaging substrate 200 attached to the redistribution structure 920 by solder material portions (such as the second solder material portions 290); a second underfill material portion 292 laterally surrounding the solder material portions (such as the second solder material portions 290); and at least one cushioning film 270 located on the packaging substrate 200 and contacting a horizontal surface of the packaging substrate 200 that is proximal to the fan-out package 900. In one embodiment, the at least one cushioning film 270 may have a Young's modulus that is lower than a Young's modulus of the second underfill material portion 292. In one embodiment, the second underfill material portion 292 may contact sidewalls of the redistribution structure 920 and sidewalls of the molding compound die frame 910. In one embodiment, the at least one cushioning film 270 may have a uniform thickness; and each of the at least one cushioning film 270 may include a portion that is located outside a periphery of an area of the fan-out package 900 in a plan view along a vertical direction that is perpendicular to a horizontal plane including the horizontal surface of the packaging substrate 200.

According to another aspect of the present disclosure, a semiconductor structure is provided, which comprises: a fan-out package 900 comprising at least one semiconductor die (700, 800), a molding compound die frame 910 that laterally surrounds the at least one semiconductor die (700, 800), a redistribution structure 920 comprising fan-out bonding pads 928, and a first underfill material portion 950 located on the redistribution structure 920 and contacting sidewalls of the at least one semiconductor die (700, 800); a packaging substrate 200 attached to the redistribution structure 920 by solder material portions (such as the second solder material portions 290); a second underfill material portion 292 laterally surrounding the solder material portions; and at least one cushioning film 270 located on the packaging substrate 200 and contacting a horizontal surface of the packaging substrate 200 that is proximal to the fan-out package 900.

The various structures and methods of the present disclosure may be used to provide a chip package structure including a fan-out package 900, a packaging substrate 200, and at least one cushioning film 270 located on the packaging substrate 200. The at least one cushioning film 270 deforms more than the molding compound material of the molding compound die frame 910 and absorbs mechanical and/or thermal stress. The various methods and structures of the present disclosure may be used to reduce deformation of a fan-out package 900 and to increase the reliability of the fan-out package 900.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure comprising:
   a fan-out package comprising at least one semiconductor die, a redistribution structure comprising fan-out bonding pads, and a first underfill material portion located between the at least one semiconductor die and the redistribution structure;
   a packaging substrate comprising chip-side bonding pads;
   solder material portions bonded to the chip-side bonding pads and the fan-out bonding pads;
   a second underfill material portion laterally surrounding the solder material portions; and
   at least one cushioning film located on the packaging substrate and contacting the second underfill material portion and having a Young's modulus lower than a Young's modulus of the second underfill material portion, wherein each of the at least one cushioning film comprises a respective top surface and a respective set of sidewalls adjoined to a periphery of the respective top surface and extending vertically to a top surface of the packaging substrate, a first region of the respective top surface is located within an area of the fan-out package in a plan view along a vertical direction that is perpendicular to a horizontal plane including bonding surfaces of the chip-side bonding pads, a second region of the respective top surface is located outside of the area of the fan-out package in the plan view, all sidewall segments among the respective set of sidewalls which are located within the area of the fan-out package in the plan view are in direct contact with the second underfill material portion, and at least one sidewall segment among the respective set of sidewalls which is located outside the area of the fan-out package is not in direct contact with the second underfill material portion and is physically exposed to an ambient gas.

2. The semiconductor structure of claim 1, wherein the at least one cushioning film has a uniform thickness.

3. The semiconductor structure of claim 2, wherein the uniform thickness is less than a maximum height of the solder material portions along a vertical direction that is perpendicular to a horizontal plane including bonding surfaces of the chip-side bonding pads.

4. The semiconductor structure of claim 1, wherein the at least one cushioning film comprises a material selected from polyimide (PI), polybenzoxazole (PBO), benzocyclobutene (BCB), and silicone.

5. The semiconductor structure of claim 1, wherein:
the second underfill material portion contacts the first region of the respective top surface of each of the at least one cushioning film and contacts a first segment of the second region of the respective top surface of each the at least one cushioning film; and
a second segment of the second region of the respective top surface of each of the at least one cushioning film is not contacted by the second underfill material portion.

6. The semiconductor structure of claim 1, wherein:
an entirety of each bottom surface of the at least one cushioning film is in contact with a top surface of the packaging substrate; and
an additional sidewall segment among the respective set of sidewalls which is located outside the area of the fan-out package is in direct contact with the second underfill material portion.

7. The semiconductor structure of claim 1, wherein:
a first portion of the at least one cushioning film has an areal overlap with the fan-out package in a plan view along a vertical direction that is perpendicular to a horizontal plane including bonding surfaces of the chip-side bonding pads; and
a second portion of the at least one cushioning film is located outside a periphery of an area of the fan-out package in the plan view.

8. The semiconductor structure of claim 1, wherein:
the at least one cushioning film comprises a frame-shaped cushioning film comprising an inner periphery and an outer periphery that laterally surrounds the inner periphery and is laterally spaced from the inner periphery; and
the inner periphery laterally surrounds the solder material portions.

9. The semiconductor structure of claim 1, wherein the at least one cushioning film comprises a plurality of rectangular cushioning films located about corner regions of the fan-out package and having a respective areal overlap with the fan-out package in the plan view.

10. A semiconductor structure comprising:
a fan-out package comprising at least one semiconductor die, a molding compound die frame that laterally surrounds the at least one semiconductor die, a redistribution structure comprising fan-out bonding pads, and a first underfill material portion located on the redistribution structure and contacting sidewalls of the at least one semiconductor die;
a packaging substrate attached to the redistribution structure by solder material portions;
a second underfill material portion laterally surrounding the solder material portions; and
at least one cushioning film located on the packaging substrate and contacting a horizontal surface of the packaging substrate that is proximal to the fan-out package, wherein each of the at least one cushioning film comprises a respective top surface and a respective set of sidewalls adjoined to a periphery of the respective top surface and extending vertically to the horizontal surface of the packaging substrate, a first region of the respective top surface is located within an area of the fan-out package in a plan view along a vertical direction that is perpendicular to a horizontal plane including bonding surfaces of the chip-side bonding pads, a second region of the respective top surface is located outside of the area of the fan-out package in the plan view, all sidewall segments among the respective set of sidewalls which are located within the area of the fan-out package in the plan view are in direct contact with the second underfill material portion, and at least one sidewall segment among the respective set of sidewalls which is located outside the area of the fan-out package is not in direct contact with the second underfill material portion and is physically exposed to an ambient gas.

11. The semiconductor structure of claim 10, wherein the at least one cushioning film has a Young's modulus that is lower than a Young's modulus of the second underfill material portion.

12. The semiconductor structure of claim 10, wherein the second underfill material portion contacts sidewalls of the redistribution structure and sidewalls of the molding compound die frame.

13. The semiconductor structure of claim 10, wherein:
the at least one cushioning film has a uniform thickness; and
each of at least one cushioning film comprises a portion that is located outside a periphery of an area of the fan-out package in a plan view along a vertical direction that is perpendicular to a horizontal plane including the horizontal surface of the packaging substrate.

14. A semiconductor structure comprising:
a fan-out package comprising at least one semiconductor die, a redistribution structure comprising fan-out bonding pads, and a first underfill material portion located between the at least one semiconductor die and the redistribution structure;
a packaging substrate comprising chip-side bonding pads;
solder material portions bonded to the chip-side bonding pads and the fan-out bonding pads;
a second underfill material portion laterally surrounding the solder material portions; and at least one cushioning film having a uniform thickness throughout and located on the packaging substrate and contacting the second underfill material portion, wherein an entirety of the at least one cushioning film is located outside a periphery of an entire area of the fan-out package in a plan view along a vertical direction that is perpendicular to a horizontal plane including bonding surfaces of the chip-side bonding pads, wherein each of the at least one cushioning film comprises a respective planar top surface and a respective set of sidewalls adjoined to a periphery of the respective planar top surface and extending vertically to a top surface of the packaging substrate, a first portion of the respective planar top surface is in direct contact with the second underfill material portion, a second portion of the respective planar top surface is not in direct contact with the second underfill material portion, first sidewall segments among the respective set of sidewalls are in direct contact with the second underfill material portion, and second sidewall segment among the respective set of sidewalls are not in direct contact with the second underfill material portion.

15. The semiconductor structure of claim 14, wherein the uniform thickness is less than a maximum height of the solder material portions along the vertical direction.

16. The semiconductor structure of claim 14, wherein:
an entirety of each bottom surface of the at least one cushioning film is in contact with a top surface of the packaging substrate; and
each of the at least one cushioning film comprises a respective first sidewall that contacts the second underfill material portion and a respective second sidewall that does not contact the second underfill material portion and is physically exposed to an ambient gas.

17. The semiconductor structure of claim 14, wherein the at least one cushioning film comprises a plurality of L-shaped cushioning films located outside corner regions of the fan-out package and not having any areal overlap with the fan-out package in the plan view.

18. The semiconductor structure of claim 14, wherein each of the at least one cushioning film is laterally offset inward relative to sidewalls of the packaging substrate by a respective lateral offset distance.

19. The semiconductor structure of claim 14, wherein:
the at least one cushioning film is a frame-shaped film having an inner periphery and an outer periphery and laterally encloses the entire area of the fan-out package in the plan view; and
the inner periphery of the frame-shaped film is laterally offset outward from the periphery of the entire area of the fan-out package in the plan view.

20. The semiconductor structure of claim 14, wherein the at least one cushioning film has a Young's modulus that is lower than a Young's modulus of the second underfill material portion.

\* \* \* \* \*